(12) United States Patent
Yamashita et al.

(10) Patent No.: US 8,990,516 B2
(45) Date of Patent: Mar. 24, 2015

(54) MULTI-CORE SHARED MEMORY SYSTEM WITH MEMORY PORT TO MEMORY SPACE MAPPING

(71) Applicant: Fujitsu Limited, Kawasaki-shi, Kanagawa (JP)

(72) Inventors: Koichiro Yamashita, Hachioji (JP); Fumihiko Hayakawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 197 days.

(21) Appl. No.: 13/623,399

(22) Filed: Sep. 20, 2012

(65) Prior Publication Data
US 2013/0019069 A1    Jan. 17, 2013

Related U.S. Application Data

(63) Continuation of application No. PCT/JP2010/055289, filed on Mar. 25, 2010.

(51) Int. Cl.
*G06F 12/00*  (2006.01)
*G06F 9/50*   (2006.01)

(52) U.S. Cl.
CPC ............ *G06F 9/5016* (2013.01); *G06F 9/5061* (2013.01)
USPC .......................................... 711/149; 711/147

(58) Field of Classification Search
CPC . G06F 13/1663; G06F 9/505; G06F 12/0284; G06F 3/0601; G06F 3/016; G06F 12/063
USPC .................................................. 711/147, 149
See application file for complete search history.

(56) References Cited

U.S. PATENT DOCUMENTS

| | | | |
|---|---|---|---|
| 5,732,041 A | 3/1998 | Joffe | |
| 5,910,928 A | 6/1999 | Joffe | |
| 6,021,086 A | 2/2000 | Joffe | |
| 6,480,941 B1 * | 11/2002 | Franke et al. | 711/153 |
| 2006/0282588 A1 * | 12/2006 | Proujansky-Bell | 710/240 |

(Continued)

FOREIGN PATENT DOCUMENTS

| | | |
|---|---|---|
| JP | 63-225846 | 9/1988 |
| JP | 8-221319 | 8/1996 |
| JP | 11-510285 | 9/1999 |

(Continued)

OTHER PUBLICATIONS

International Search Report of PCT/JP2010/055289 mailed Jun. 8, 2010.

(Continued)

*Primary Examiner* — Gurtej Bansal
(74) *Attorney, Agent, or Firm* — Staas & Halsey LLP

(57) ABSTRACT

A multi-core processor system includes a memory controller that includes multiple ports and shared memory that includes physical address spaces divided among the ports. A CPU acquires from a parallel degree information table, the number of CPUs to which software that is to be executed by the multi-core processor system, is to be assigned. After this acquisition, the CPU determines the CPUs to which the software to be executed is to be assigned and sets for each CPU, physical address spaces corresponding to logical address spaces defined by the software to be executed. After this setting, the CPU notifies an address converter of the addresses and notifies the software to be executed of the start of execution.

6 Claims, 17 Drawing Sheets

(56) References Cited

U.S. PATENT DOCUMENTS

| | | | |
|---|---|---|---|
| 2007/0118721 A1* | 5/2007 | Stewart et al. ................. | 712/15 |
| 2009/0024803 A1 | 1/2009 | Kwon et al. | |

FOREIGN PATENT DOCUMENTS

| | | |
|---|---|---|
| JP | 2003-114797 | 4/2003 |
| JP | 2003-316752 | 11/2003 |
| JP | 2008-117109 | 5/2008 |
| JP | 2009-26439 | 2/2009 |
| WO | WO 97/06489 | 2/1997 |
| WO | WO 2009/057208 | 5/2009 |

OTHER PUBLICATIONS

Japanese Office Action mailed Oct. 8, 2013 in corresponding Japanese Application No. 2012-506730.
Extended European Search Report mailed Oct. 30, 2013 in corresponding European Application No. 10848406.4.
Andrew S. Tanenbaum, "Modern Operating Systems", Second Edition, Feb. 21, 2001, XP-002714625, pp. 132-139, 521-523.
Japanese International Preliminary Report on Patentability for PCT/JP2010/055289(11 pgaes).
European Patent Office Action dated Jan. 14, 2015 in corresponding European Patent Application No. 10 848 406.4.

* cited by examiner

FIG.7

| SOFTWARE NAME | PARALLEL DEGREE INFORMATION | PARALLEL COUNT P |
|---|---|---|
| UI PROCESS | INDEPENDENT | 1 |
| WEB BROWSER | PARALLEL | 3 |

~401

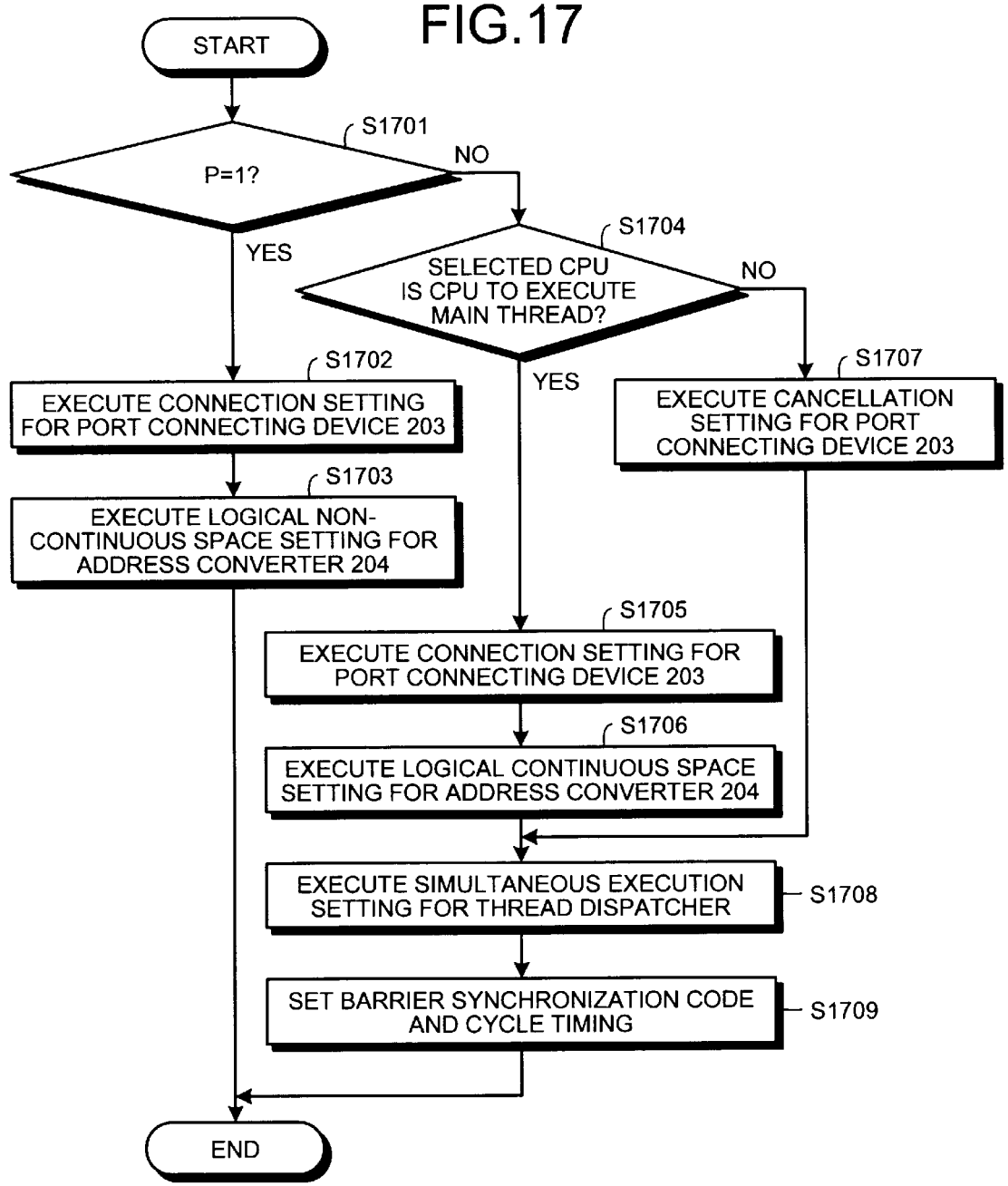

US 8,990,516 B2

MULTI-CORE SHARED MEMORY SYSTEM WITH MEMORY PORT TO MEMORY SPACE MAPPING

CROSS REFERENCE TO RELATED APPLICATIONS

This application is a continuation application of International Application PCT/JP2010/055289, filed on Mar. 25, 2010 and designating the U.S., the entire contents of which are incorporated herein by reference.

FIELD

The embodiments discussed herein are related to a multi-core processor system, memory controller control method, and memory controller control program that control a memory controller.

BACKGROUND

As a memory accessed by multiple central processing units (CPUs), multi-port memory that includes multiple memory banks each capable of storing data and multiple input and output ports is conventionally known. A technique of using a memory controller as an apparatus to control memory when a CPU reads and writes data with respect to the memory is also known. Another technique is disclosed according to which a buffer mechanism is provided between memory and a bus or between a CPU and a bus, and a memory controller has a function of automatically branching data to a given port, in addition to a function of temporarily causing data to be retained in the buffer, (see, e.g., Published Japanese-Translation of PCT Application, Publication No. H11-510285).

A further technique is disclosed according to which a path for requests and that for responses are separated from each other, and a CPU is enabled to immediately proceed to the next process by a mechanism consequent to a memory controller that controls a multi-port memory immediately sending back a dummy response in response to a request from the CPU (see, e.g., Japanese Laid-Open Patent Publication No. 2008-117109).

A technique is disclosed as a technique of using multiple ports according to which address spaces are divided among the function types and a port is prepared for each group of address spaces, whereby multiple functions can be concurrently be executed and processes can be executed at a high speed (see, e.g., Japanese Laid-Open Patent Publication No. 2003-114797).

Among the conventional techniques, the technique according to Japanese Laid-Open Patent Publication No. H11-510285 enables minimization of latency on the paths by setting the clock to be high between the memory and the buffer and between the bus and the buffer. However, a problem arises in that power consumption increases consequent to setting the clock to be high. A problem also arises in the technique according to Japanese Laid-Open Patent Publication No. 2008-117109 in that access contention still continues to occur even when the path for requests and that for responses are separated from each other. Another problem also arises in that power consumption increases because the clock becomes high between the bus and the buffer, similarly to the technique according to Japanese Laid-Open Patent Publication No. H11-510285.

A problem arises in the technique according to Japanese Laid-Open Patent Publication No. 2003-114797 in that access contention occurs when software, each having a function different from the other, access the same address space. A port needs to be prepared for each type of function and the number of ports increases as of the number of function types increases. Therefore, another problem arises in that power consumption increases.

SUMMARY

According to an aspect of an embodiment, a multi-core processor system includes multiple cores; a memory controller including a plurality of ports corresponding to the cores; and shared memory including physical address spaces divided among the ports. A designated core among the cores is configured to acquire from a database storing for each software, the number of cores to which the software is to be assigned, the number of cores to which software to be executed is to be assigned; determine cores to which the software to be executed is to be assigned, based on the acquired number of cores and a state of use of the cores; set, for each of the determined cores, physical address spaces that correspond to logical address spaces defined by the software to be executed and are among physical address spaces accessible by a designated port that is among the ports and corresponds to the determined cores; notify the designated port of the set physical address spaces and the logical address spaces corresponding to the set physical address spaces; and notify the software to be executed of a start of execution after notification to the designated port has been executed.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is an explanatory diagram of an example of the content of the parallel degree information table 401;

FIG. 17 is a flowchart of an address space conversion process.

DESCRIPTION OF EMBODIMENTS

Preferred embodiments of a multi-core processor system, a memory controller control method, and a memory controller control program according to the invention will be described in detail with reference to the accompanying drawings.

Figure 1:
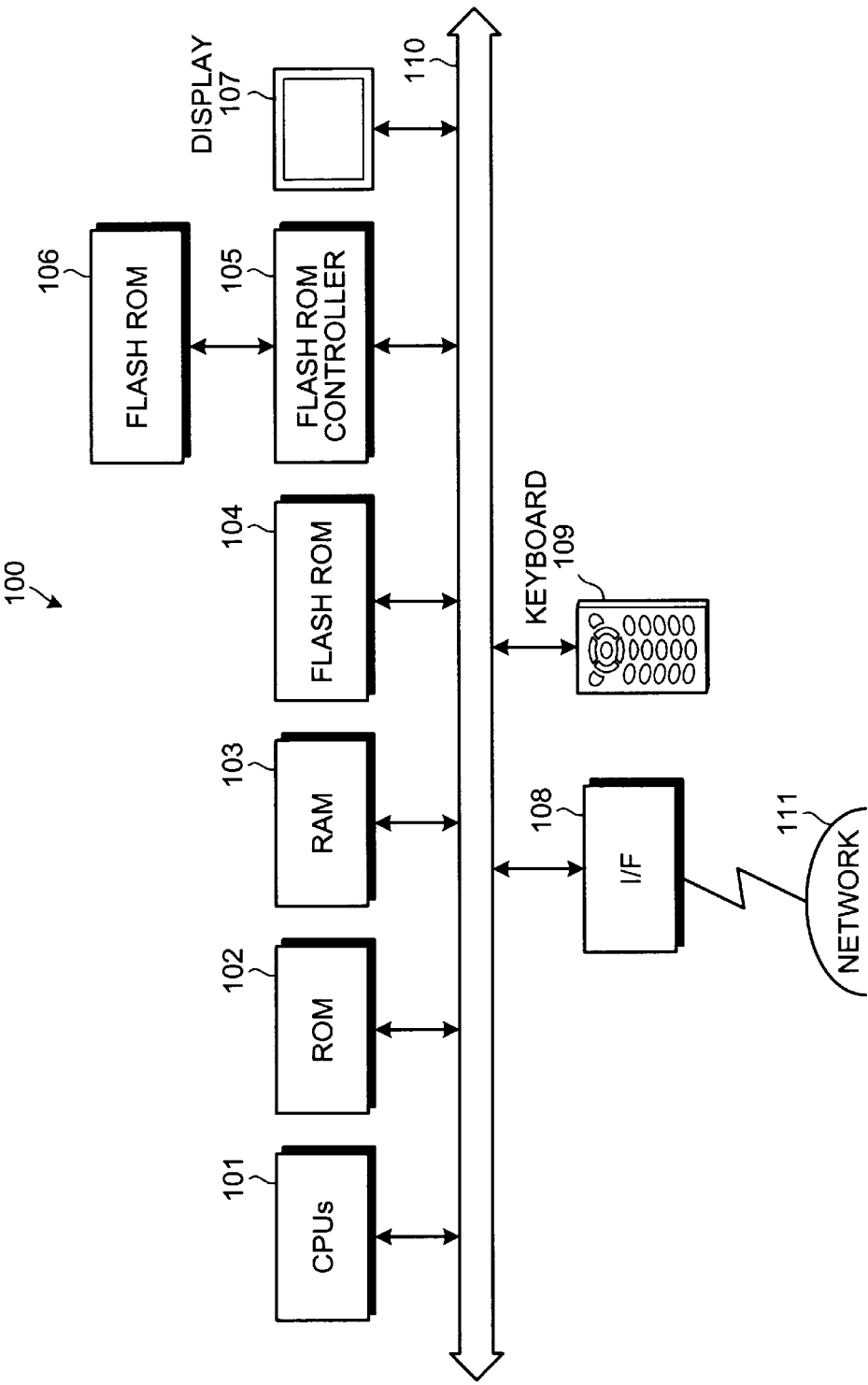
FIG. 1 is a block diagram of a hardware configuration of a multi-core processor system according to an embodiment.

FIG. 1 is a block diagram of a hardware configuration of a multi-core processor system according to an embodiment. In FIG. 1, the multi-core processor system 100 includes multiple CPUs 101, read-only memory (ROM) 102, and random access memory (RAM) 103, flash ROMs 104 and 106, and a flash ROM controller 105. The multi-core processor system 100 further includes a display 107, an interface (I/F) 108, and a keyboard 109 as devices for input and output with respect to a user and other apparatuses. The components are connected, respectively, by a bus 110.

The CPUs 101 supervise control of the entire multi-core processor system 100. The term "CPUs 101" refers to all of the CPUs, which are single-core processors connected in parallel. The details of the CPUs 101 will be described with reference to FIG. 2. The "multi-core processor system" is a computer system that includes processors equipped with multiple cores. In the embodiment, it is a premise that the multi-core processor system 100 employs architecture for CPUs to share memory regardless of the method of connecting the CPUs, i.e., tightly coupled multi-processor (TCMP) architecture. In the embodiment, for the sake simplicity, description will be made taking an example of a processor group of single-core processors connected in parallel.

The ROM 102 stores programs therein such as a boot program. The RAM 103 is used as a work area of the CPUs 101. The flash ROM 104 stores system software such as an operating system (OS); application software; etc. For example, when the OS is updated, the multi-core processor system 100 receives a new OS using the I/F 108 and updates to the newly received OS, the old OS stored in the flash ROM 104.

The flash ROM controller 105 controls the reading and writing of data with respect to the flash ROM 106 according to the control of the CPUs 101. The flash ROM 106 stores data therein that is written under the control of the flash ROM controller 105. Examples of the data include image data, video image data, etc., acquired through the I/F 108 by a user using the multi-core processor system 100. For example, a memory card, an SD card, etc. can be employed as the flash ROM 106.

The display 107 displays, for example, data such as text, images, functional information, etc., in addition to a cursor, icons, and/or tool boxes. A thin-film-transistor (TFT) liquid crystal display and the like may be employed as the display 107.

The I/F 108 is connected to a network 111 such as a local area network (LAN), a wide area network (WAN), and the Internet through a communication line and is connected to other apparatuses through the network 111. The I/F 108 administers an internal interface with the network 111 and controls the input and output of data with respect to external apparatuses. For example, a modem or a LAN adaptor may be employed as the I/F 108.

The keyboard 109 includes, for example, keys for inputting letters, numerals, and various instructions and performs the input of data. Alternatively, a touch-panel-type input pad or numeric keypad, etc. may be adopted.

Figure 2:
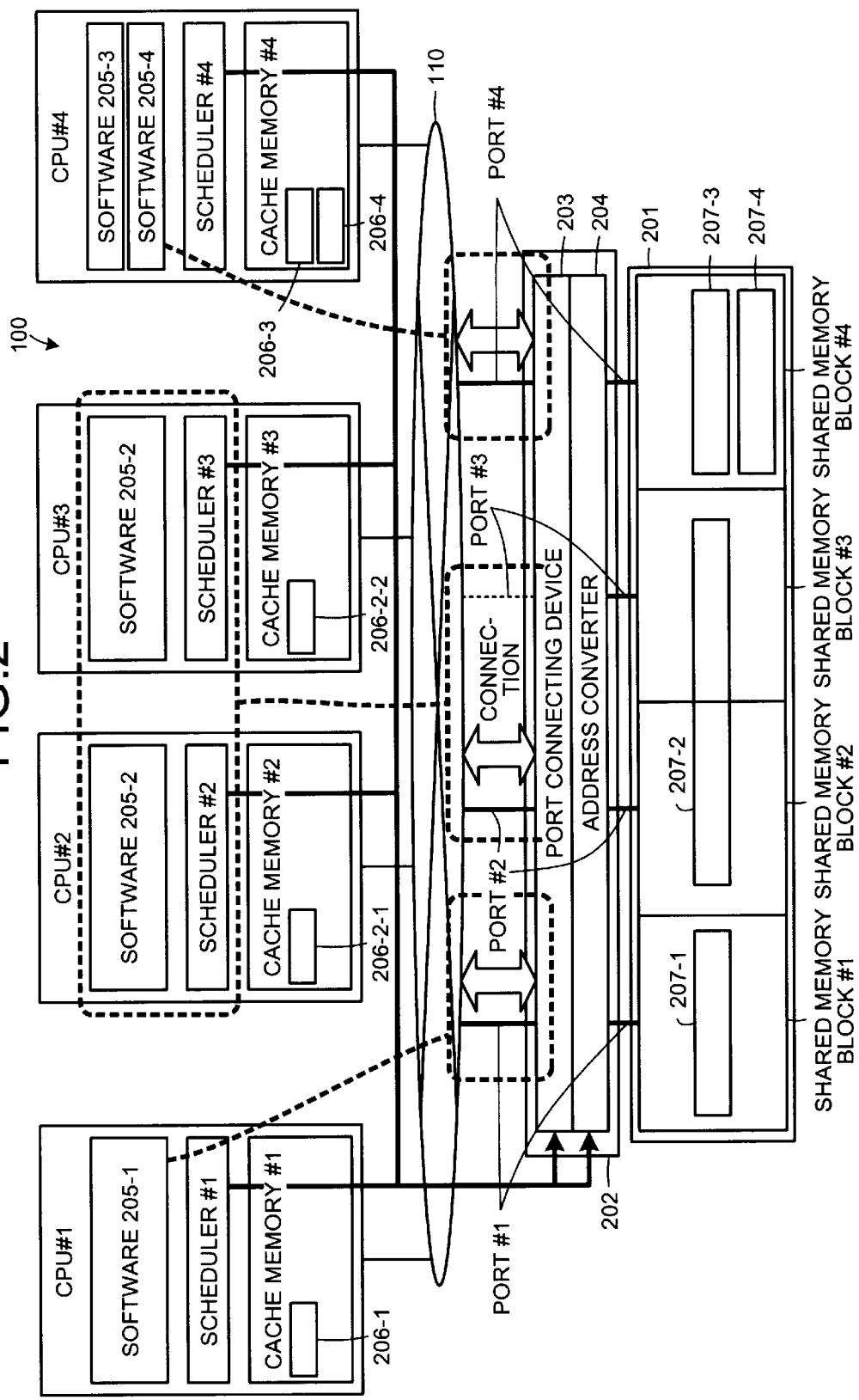
FIG. 2 is a block diagram of a portion of the hardware, and software of a multi-core processor system 100.

FIG. 2 is a block diagram of a portion of the hardware, and software of the multi-core processor system 100. The hardware depicted in FIG. 2 includes shared memory 201, a memory controller 202, and CPUs #1 to #4 that are included among the CPUs 101. The memory controller 202 and the CPUs #1 to #4 are connected to each other by the bus 110. Among the reference numerals appearing hereinafter, reference numerals appended with any one of #1 to #4 indicate correspondence with the respective CPU #1 to #4.

The shared memory 201 is a storage area that is accessible through the memory controller 202. A "storage area" is, for example, the ROM 102, the RAM 103, or the flash ROM 104. The shared memory 201 has ports #1 to #4 that are accessible lines. The CPUs #1 to #4 can each access any one of the ports #1 to #4. In the embodiment, the CPUs #1 to #4 respectively control the ports #1 to #4.

The shared memory 201 is divided into shared memory blocks #1 to #4 formed by dividing the physical address spaces among the ports #1 to #4. The physical address spaces of the shared memory blocks #1 to #4 may be continuous or may be separated from each other. The shared memory 201 may be present as one memory bank or one shared memory block may be present as one memory bank.

The port #1 can access the shared memory block #1 as an initial state. Similarly, the ports #2 to #4 can respectively access the shared memory blocks #2 to #4. However, one port may be able to access multiple shared memory blocks depending on the setting of the ports. For example, by changing the setting of the port #1, the port #1 can access the shared memory blocks #1 and #2.

The memory controller 202 has a function of reading and writing data with respect to the shared memory 201. In the embodiment, the memory controller 202 controls access of the shared memory 201 by the CPUs #1 to #4, by changing the settings of the ports #1 to #4 for accessing the shared memory 201.

A port connecting device 203 in the memory controller 202 sets the ports #1 to #4 to be connected or disconnected. In the example depicted in FIG. 2, the port connecting device 203 sets the port #3 on the side of the bus 110 to be disconnected. An address converter 204 in the memory controller 202 converts the addresses of the ports #1 to #4. An example of the conversion method will be described later with reference to FIG. 3. The CPUs #1 to #4 respectively have cache memories #1 to #4.

Software depicted in FIG. 2 includes schedulers #1 to #4 and software 205-1 to 205-4. Cache memory blocks 206-1 to 206-4 and shared memory blocks 207-1 to 207-4 are storage areas accessed by the software.

The schedulers #1 to #4, based on the state of use of each of the CPUs #1 to #4, determine the CPU that is to execute software that has been requested for startup by the OS or the user. For example, the schedulers #1 to #4 determine that the least-used CPU among the CPUs #1 to #4 is the CPU requested for startup. The schedulers #1 to #4, based on the software requested for startup, notify the port connecting device 203 and the address converter 204 of the setting.

The software 205-1 is executed by the CPU #1. The CPU #1 is caused to access the cache memory block 206-1 by the software 205-1 and if the necessary data is not present in the cache memory block 206-1, the CPU #1 is caused to access the shared memory block 207-1 through the port #1.

The software 205-2 is executed by the CPU #2 and #3. The CPU #2 is caused to access the cache memory block 206-2-1 by the software 205-2 and if the necessary data is not present in the cache memory block 206-2-1, the CPU #2 is caused to access the shared memory block 207-2 through the port #2. The CPU #3 is also caused to access the cache memory block 206-2-2 by the software 205-2 and if the necessary data is not present in the cache memory block 206-2-2, the CPU #3 is caused to access the shared memory block 207-2 through the port #2.

The software 205-3 and 205-4 are executed by the CPU #4 and the CPU #4 is caused to access the cache memory blocks 206-3 and 206-4 that respectively correspond to the software 205-3 and 205-4. If the necessary data is not present in these cache memory blocks, the CPU #4 is caused to access the shared memory blocks 207-3 and 207-4 through the port #4.

Figure 3:
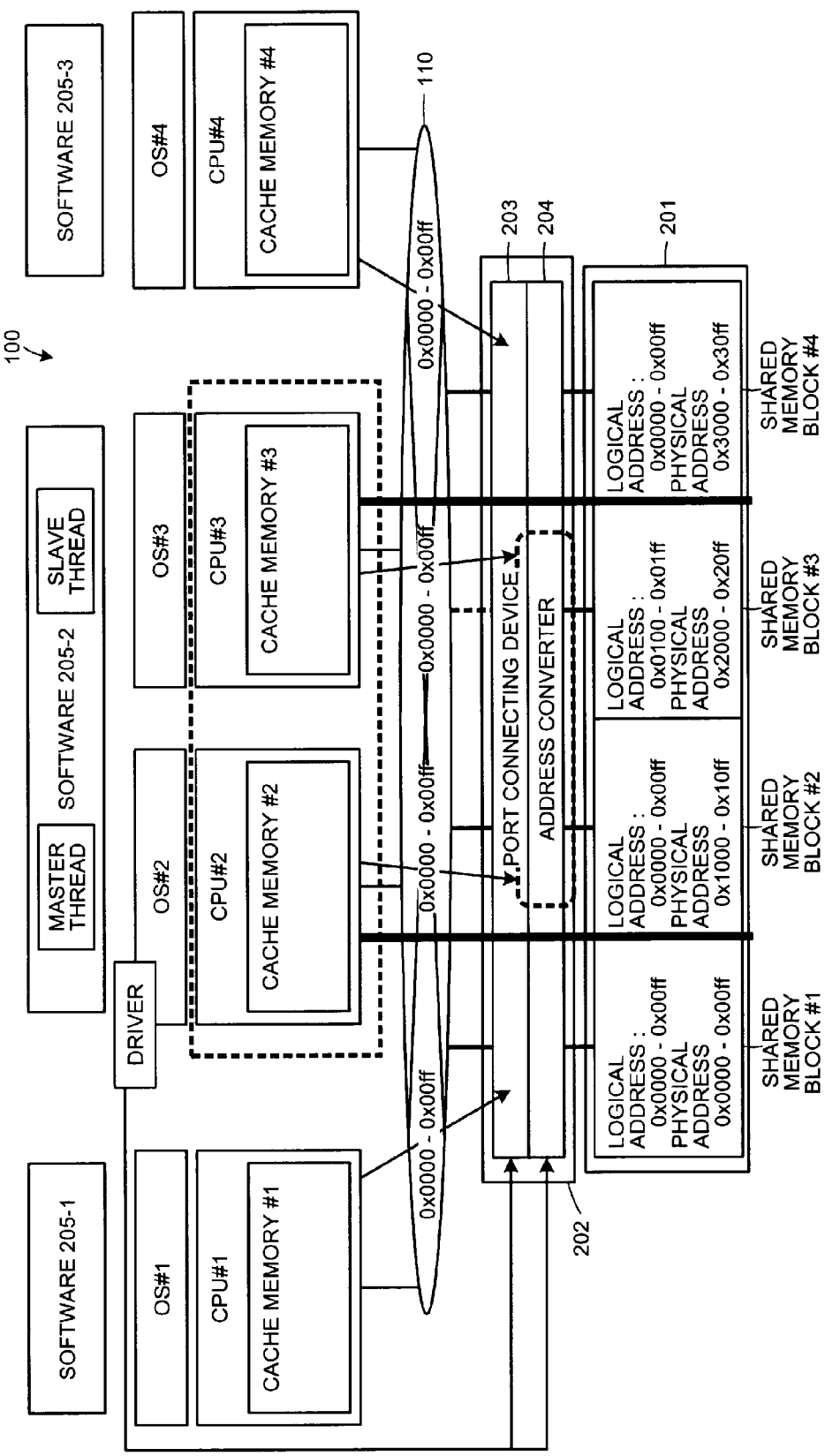
FIG. 3 is an explanatory diagram of an example of division of physical address spaces and coupling of logical address spaces.

FIG. 3 is an explanatory diagram of an example of the division of the physical address spaces and coupling of logical address spaces. The setting is made as follows of the physical address spaces of the shared memory blocks #1 to #4 including the shared memory 201 as hardware. The physical address spaces of the shared memory block #1 are denoted by "0x0000" to "0x00ff". Similarly, the physical address spaces of the shared memory block #2 are denoted by "0x1000" to "0x10ff". The physical address spaces of the shared memory block #3 are denoted by "0x2000" to "0x20ff". The physical address spaces of the shared memory block #4 are denoted by "0x3000" to "0x30ff".

A case is assumed where the logical address spaces accessed by the software 205-1 are "0x0000" to "0x00ff" in the above state. To access the port #1, the CPU #1 causes the port #1 to be connected using the port connecting device 203, and sets the address converter 204 to be in an address-through state because the logical address spaces and the physical address spaces of the shared memory block #1 are the same. The setting of "address-through" is a setting to use the logical addresses as the physical addresses without converting the logical addresses, to access the shared memory 201.

A case is assumed where the logical address spaces accessed by the software 205-2 are "0x0000" to "0x01ff". A master thread of the software 205-2 executed by the CPU #2 is also assumed to access "0x0000" to "0x01ff" as the logical address. To access the port #2, the CPU #2 causes the port #2 to be connected using the port connecting device 203.

The CPU #2 notifies the port #2 of conversion of the logical address spaces, and the physical address spaces of the shared memory blocks #2 and #3 by the address converter 204. The port #2 receives the notification and thus, converts the logical addresses "0x0000" to "0x00ff" to the physical addresses "0x1000" to "0x10ff" and also converts the logical addresses "0x0100" to "0x01ff" to the physical addresses "0x2000" to "0x20ff". For example, when the CPU #2 accesses the logical address that is "0x0010", this logical address "0x0010" is converted into the physical address that is "0x1010" by the address converter 204. Thereby, the address converter 204 is able to provide the software with physical address spaces that are not continuous, as the logical spaces that are continuous.

Similarly, a slave thread of the software 205-2 executed by the CPU #3 is assumed to access "0x0000" to "0x01ff" as the logical addresses. The CPU #3 accesses the port #2 and does not access the port #3 and therefore, causes the port #3 to be disconnected using the port connecting device 203.

The logical address spaces accessed by the software 205-3 are assumed to be "0x0000" to "0x00ff". To access the port #4, the CPU #4 causes the port #4 to be connected using the port connecting device 203.

The CPU #4 notifies the port #4 of conversion of the logical address spaces, and the physical address spaces of the shared memory block #4. The port #4 receives the notification and thus, converts the logical addresses "0x0000" to "0x00ff" into the physical addresses "0x3000" to "0x30ff". The state where the logical addresses "0x0000" to "0x00ff" are converted into the physical addresses "0x3000" to "0x30ff" may be set to be the initial conversion state and, when the CPU #4 sets the address-through state, the address converter 204 may convert the addresses in the initial conversion state.

Figure 4:
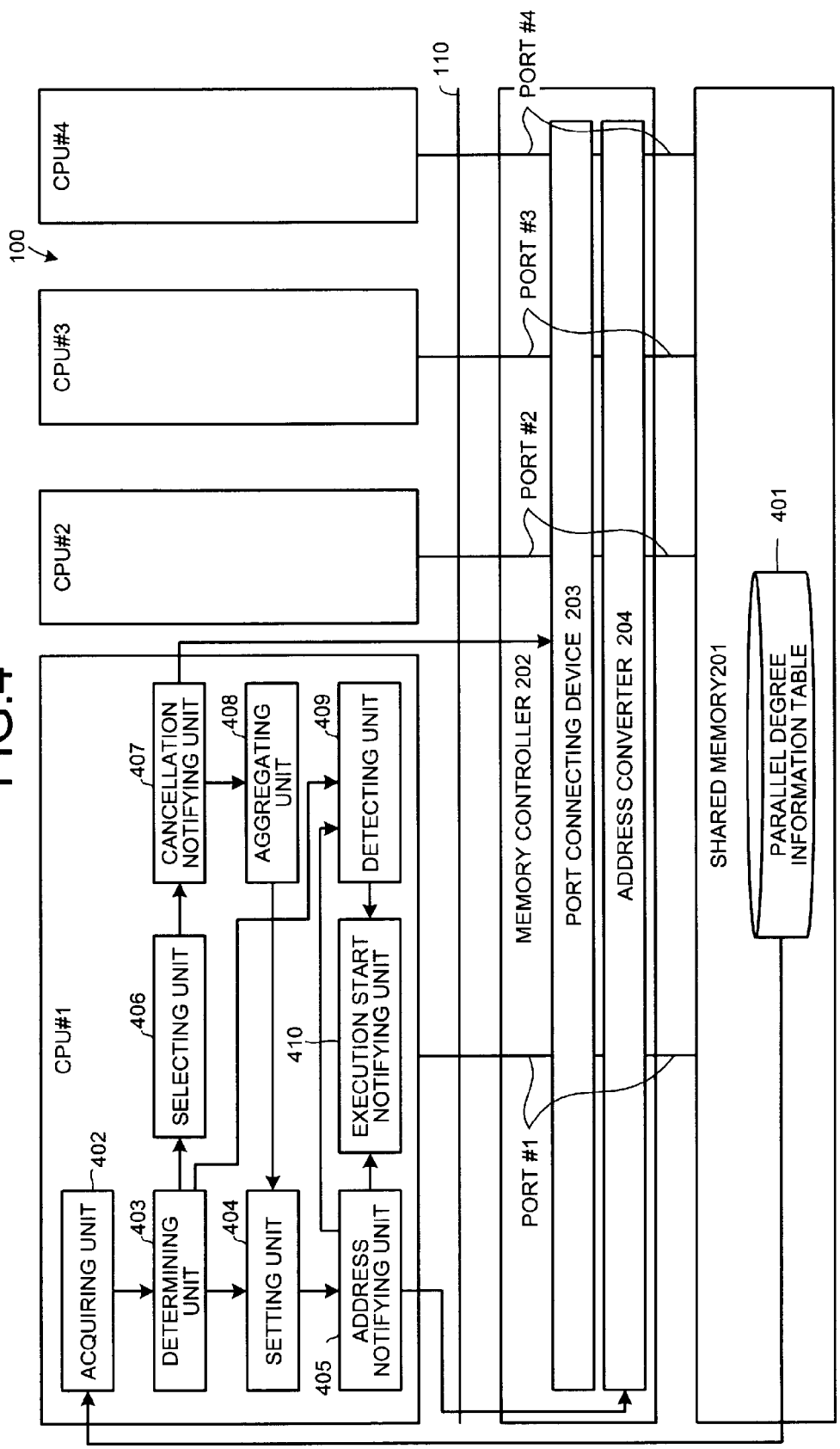
FIG. 4 is an explanatory block diagram of relations among components in the multi-core processor system 100.

Operations of the multi-core processor system 100 will be described. FIG. 4 is an explanatory block diagram of the relations among components in the multi-core processor system 100. The multi-core processor system 100 includes, for example, an acquiring unit 402, a determining unit 403, a setting unit 404, an address notifying unit 405, a selecting unit 406, a cancellation notifying unit 407, an aggregating unit 408, a detecting unit 409, and an execution start notifying unit 410. The units from the acquiring unit 402 to the execution start notifying unit 410 constituting a control unit are implemented by executing on the CPUs 101, the programs stored in a storage device. The "storage device" is, for example, the ROM 102, the RAM 103, or the flash ROM 104 depicted in FIG. 1, etc. Otherwise, another CPU may execute the programs through the I/F 108.

The multi-core processor system 100 includes multiple cores, a memory controller 202 having multiple ports that correspond to the cores, and a shared memory 201 having the physical address spaces divided among the ports. The cores may be all the CPUs 101 or may be a portion of the CPUs 101 to which the embodiment is applicable. The ports corresponding to the cores are designated ports accessed by the CPUs and a port corresponding to a CPU is determined such as, for example, the port #1 for the CPU #1 and the port #2 for the CPU #2. In FIG. 4, the number of the CPUs and the number of the ports are equal to each other and therefore, the CPUs and the ports correspond to each other one to one. However, when the number of ports is smaller than the number of CPUs, a single port may correspond to different CPUs.

Each port is set to be able to access the physical address spaces formed by dividing the physical address spaces of the shared memory 201. For example, when the physical address spaces of the shared memory 201 are "0x0000" to "0x01ff", the port #1 is set to be able to access the physical address spaces of "0x0000" to "0x00ff", and the port #2 is set to be able to access the physical address spaces of "0x0100" to "0x01ff". The division method may be a method of evenly or unevenly dividing the physical address spaces for the ports as above.

The multi-core processor system 100 has to access a parallel degree information table 401 as a database that for each software, stores the number of cores to which the software is assigned. For example, the software 205-1 and 205-2 are registered respectively as independent software to which one CPU is assigned and as parallel software to which two CPUs are assigned. The details of the parallel degree information table 401 will be described later with reference to FIG. 7.

The acquiring unit 402 has a function of acquiring from the parallel degree information table 401, the number of cores to which software that is to be executed is assigned. Software that is to be executed is software for which a startup request is received from the user of the OS, or software to again be executed by a scheduler after the assignment of the software to a CPU is cancelled subsequent to being executed by the scheduler. For example, when the software 205-2 is the software to be executed, the acquiring unit 402 acquires from the parallel degree information table 401, the number of CPUs to be assigned, which is two. The acquired data is stored in a storage area such as the RAM 103 or the flash ROM 104.

The determining unit 403 has a function of determining the cores to which the software to be executed is to be assigned, based on the state of use of the cores and the number of cores to which the software to be executed is assigned as acquired by the acquiring unit 402.

For example, a case is assumed as an example of the determining unit 403 where the software to be executed is the software 205-2 and the number of CPUs to be assigned is two as acquired by the acquiring unit 402. The determining unit 403 determines that the CPUs #2 and #3 as low-load CPUs of the CPUs 101 are the CPUs to which the software 205-2 is assigned. Information concerning the determined CPUs is stored in the storage area such as the RAM 103 or the flash ROM 104.

The setting unit 404 acquires the physical address spaces that are accessible from a designated port corresponding to the core determined by the determining unit 403 of the plurality of ports. The setting unit 404 has a function of setting for each determined core, the physical address spaces corresponding to the logical address spaces defined by the software to be executed, from the acquired physical address spaces. The setting unit 404 may set the physical address spaces aggregated by the aggregating unit 408, in the physical address spaces that are newly accessible from the port selected by the selecting unit 406.

For example, it is assumed that the determined cores are the CPUs #2 and #3 and the ports corresponding to the CPUs are the ports #2 and #3. It is also assumed that the physical address spaces for the port #2 to be able to access the shared memory 201 are "0x1000" to "0x10ff" and the physical address spaces for the port #3 to be able to access the shared memory 201 are "0x2000" to "0x20ff".

Here, the setting unit 404 sets for each determined CPU, the physical address spaces corresponding to the logical address spaces defined by the software to be executed, from the physical address spaces "0x1000" to "0x10ff" and "0x2000" to "0x20ff". In a case where the defined logical address spaces are "0x0000" to "0x01ff", when the CPU #2 accesses the port #2, the setting unit 404 sets the logical address spaces "0x0000" to "0x00ff" correlating these spaces with the physical address spaces "0x1000" to "0x10ff". Similarly, when the CPU #3 accesses the port #3, the setting unit 404 sets the logical address spaces "0x0100" to "0x01ff" correlating these spaces with the physical address spaces "0x2000" to "0x20ff". Information on the address correlations set is stored in the storage area such as the RAM 103 or the flash ROM 104.

The address notifying unit 405 has a function of notifying the designated port of the physical address spaces set by the setting unit 404 and the logical address spaces corresponding to the physical address spaces set. The address notifying unit 405 may notify the port selected by the selecting unit 406 of the physical address spaces that are newly accessible set by the setting unit 404.

For example, it is assumed that, when the CPU #2 accesses the port #2, the logical address spaces "0x0000" to "0x00ff" are set being correlated with the physical address spaces "0x0100" to "0x01ff". In this case, the address notifying unit 405 notifies the port #2 of the address converter 204 of the information concerning the address correlation set by the CPU #2. It is assumed that the physical address spaces aggregated by the aggregating unit 408 are "0x0000" to "0x01ff" and the selecting unit 406 selects the port #2. In this case, the address notifying unit 405 notifies the port #2 of "0x0000" to "0x01ff" as the physical address spaces that are newly accessible from the port #2.

When a range is determined as the information concerning the address correlation, settable patterns may be prepared. For example, when four ports are present and the physical address spaces of the shared memory 201 are divided into four, the resulting physical address spaces may be correlated with bit strings in a register. The logical address spaces may be correlated such that the spaces start with "0x0000" and the address spaces are continuous.

Thus, by setting a specific bit of the register to be "1", the physical addresses and the logical addresses can be correlated with each other. In this manner, the address notifying unit 405 can give notification of the upper limit value and the lower limit value of the physical address spaces, the upper limit value and the lower limit value of the logical addresses, or may simplify the notifying process by preparing settable patterns.

The case as above is assumed where the physical address spaces of the shared memory 201 are divided into four. In this case, the setting unit 404 sets the bit of the register corresponding to the physical address spaces "0x0200" to "0x02ff" to be "1" and correlates the physical address spaces "0x0200" to "0x02ff" with the logical address spaces "0x0000" to "0x00ff". The address notifying unit 405 may give notification of the value of the set register. When the head and the third physical address spaces are aggregated among the four physical address spaces, the address notifying unit may give notification of the corresponding bit "0b1010". Information concerning the address correlation for which notification is given may be stored in a storage area such as the RAM 103 or the flash ROM 104.

When multiple designated ports are present that correspond to the cores determined by the determining unit 403, the selecting unit 406 has a function of selecting an arbitrary port among the designated ports. For example, when the CPUs #2 and #3 are determined by the determining unit 403 and multiple corresponding ports are present such as the ports #2 and #3, the selecting unit 406 selects the port #2 as the arbitrary port.

Although the criterion for selecting the ports may be taken in any manner, for example, a port may be selected that corresponds to the CPU executing the master thread of the software to be executed. When the performance of the ports is asymmetrical and the capacity of a designated port among the ports is higher than that of the other ports, the selecting unit 406 may select the port whose performance is higher than that of the other ports. The information concerning the port selected is stored in the storage area such as the RAM 103 or the flash ROM 104.

The cancellation notifying unit 407 has a function of notifying the ports remaining among the designated ports after excluding the port selected by the selecting unit 406, of cancellation of the connection of each of the remaining ports. For example, when the designated ports are the ports #2 and #3 and the port #2 is selected by the selecting unit 406, the cancellation notifying unit 407 notifies the remaining port #3 of the port connecting device 203, of cancellation of the port connection of the remaining port #3. Information concerning the cancellation of the connection may be stored in the storage area such as the RAM 103 or the flash ROM 104.

The aggregating unit 408 has a function of aggregating the physical address spaces that are accessible by the designated ports. For example, it is assumed that the designated ports are the ports #2 and #3 and the physical address spaces thereof respectively are "0x0000" to "0x00ff" and "0x0100" to "0x01ff". In this state, the aggregating unit 408 sets the physical address spaces aggregated to be "0x0000" to "0x01ff". The information concerning the aggregated physical addresses is stored in a storage area such as the RAM 103 or the flash ROM 104.

When multiple cores are determined by the determining unit 403, the detecting unit 409 has a function of detecting the starting time to concurrently execute the software to be executed using the determined cores. The detecting unit 409 detects as the starting time, the time at which notification is completed by the address notifying unit 405 to the designated ports. For example, when the determined CPUs are the CPUs #2 and #3 and the designated port is the port #2, the detecting unit 409 is able to detect as the starting time of the software to be executed, the time at which execution of the address notifying unit 405 is completed by the CPU #2 or #3 for the port #2. Information concerning execution of the detection is stored in a storage area such as the RAM 103 or the flash ROM 104.

The execution start notifying unit 410 has a function of notifying the software to be executed of the start of execution after the address notifying unit 405 notifies the designated ports. The execution start notifying unit 410 may notify the software to be executed of the start of execution after the detecting unit 409 detects the starting time.

For example, the CPU #2 is able to notify the software to be executed of the start of execution after executing the address notification for the port #2. When the determined CPUs are the CPUs #2 and #3, the CPUs #2 and #3 are able to notify the software to be executed of the start of execution after the detecting unit 409 detects the starting time. The notification of the start of the execution may be stored in a storage area such as the RAM 103 or the flash ROM 104.

Figure 5:
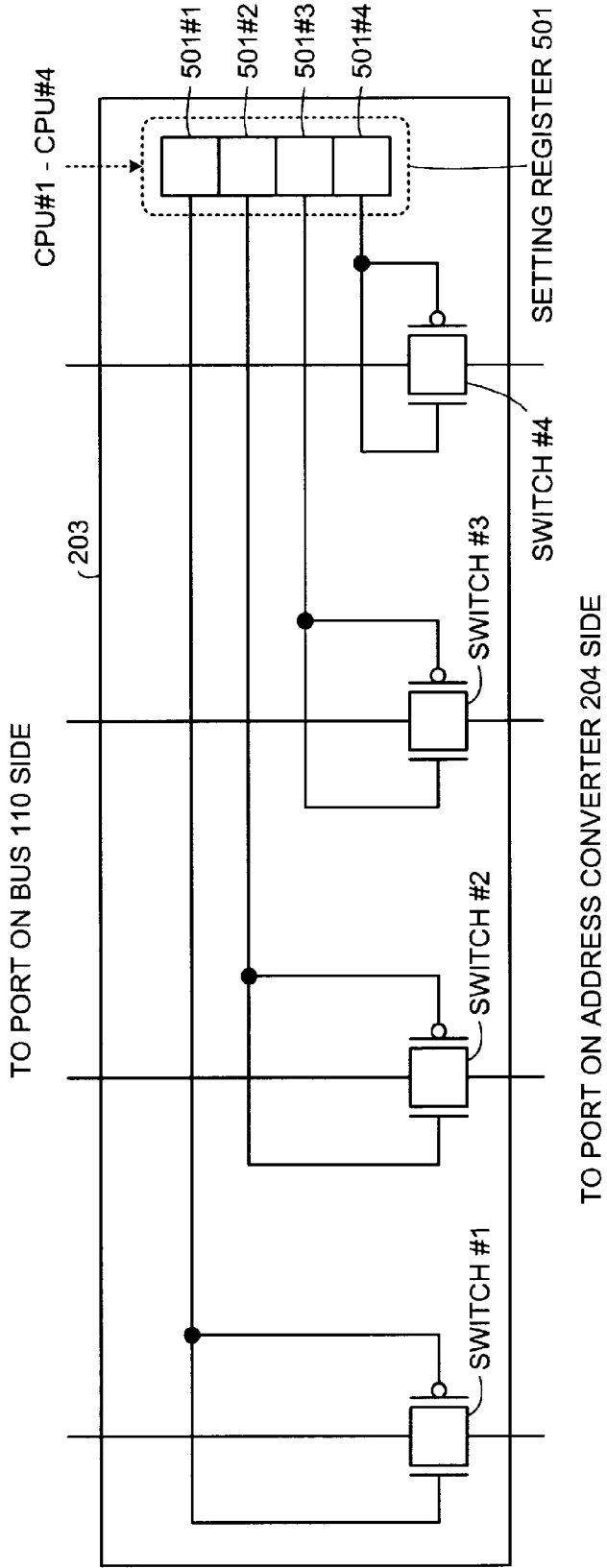
FIG. 5 is a block diagram of a port connecting device 203.

FIG. 5 is a block diagram of the port connecting device 203. The port connecting device 203 is one form of the memory controller 202, is located between the bus 110 and the address converter 204, and controls the connection and disconnection of each of the ports. The connection and disconnection of the ports are controlled by a setting register 501 accessed by the CPUs #1 to #4. The setting register 501 includes setting registers 501#1 to 501#4 and controls the connection and disconnection of the ports.

For example, the setting register 501#1 controls a switch #1 and sets the connection and disconnection of the port #1. The setting register 501#1 causes the port #1 to be connected when a setting value is "1", and causes the port #1 to be disconnected when the setting value is "0". Similarly, the other setting registers such as the setting registers 501#2 to 501#4 respectively set connection and disconnection of the ports #2 to #4. No electrical power is supplied to the wiring for the port that is caused to be disconnected. As a result, an effect of saving electrical power can be achieved by causing a port to be disconnected when the port is unnecessary.

Figure 6:
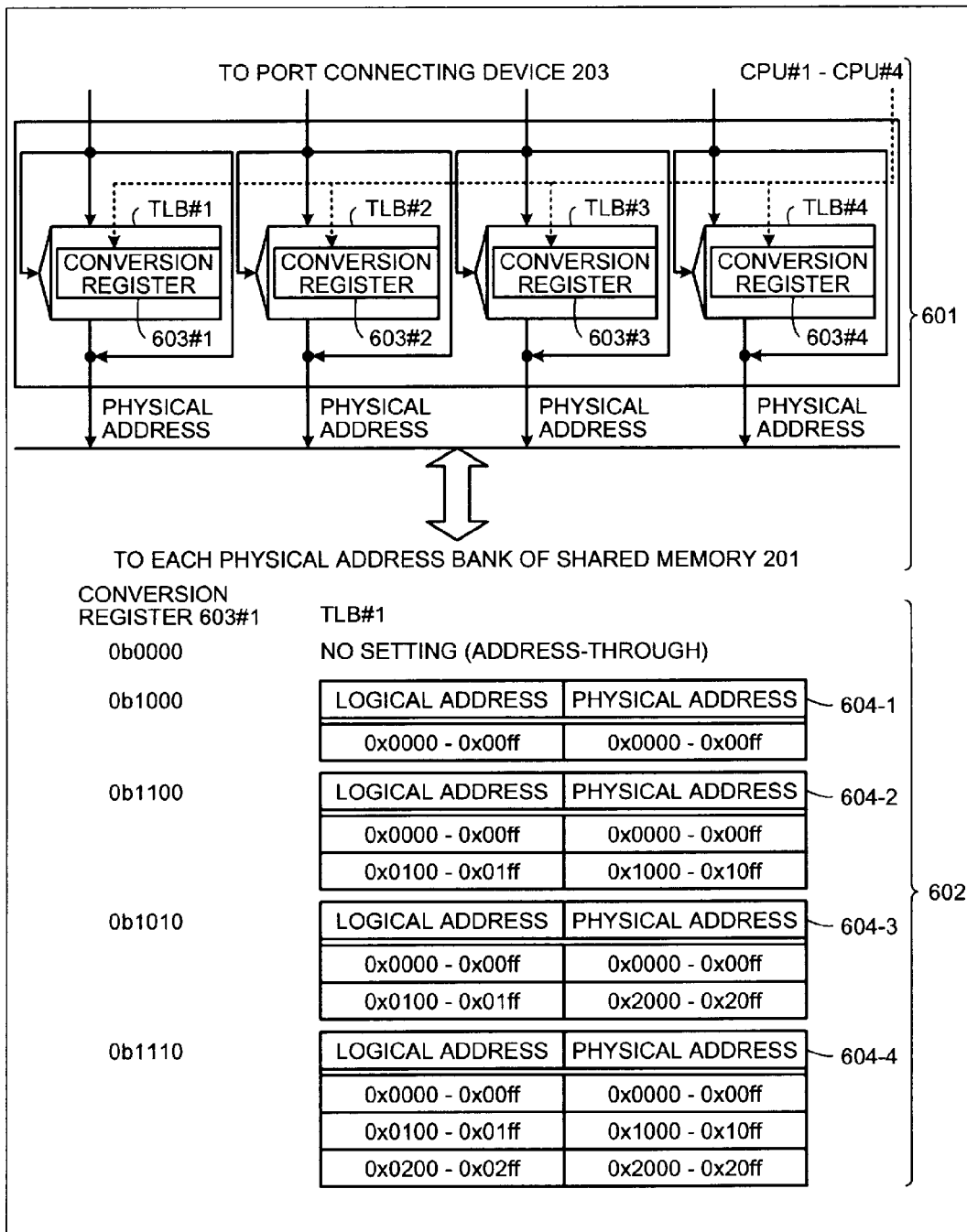
FIG. 6 is an explanatory diagram of an example of an address converter 204.

FIG. 6 is an explanatory diagram of an example of the address converter 204 and its setting. Reference numeral "601" depicts the address converter 204. The address converter 204 is one form of the memory controller 202, is located between the port connecting device 203 and the shared memory 201, and inter-converts the logical addresses and the physical addresses of each port. The conversion of the logical addresses and the physical addresses of each port is controlled by conversion registers 603#1 to 603#4 accessed by the CPUs #1 to #4.

The conversion register 603#1 as one embodiment controls a translation lookaside buffer (TLB) #1. The TLB #1 converts the logical address spaces and the physical address spaces of the port #1. Reference numeral "602" indicates an example of the relationship between the conversion register 603#1 and the TLB #1. The content set in the TLB #1 changes according to the setting of the conversion register 603#1. For example, when the CPU #1 sets "0b0000" in the conversion register 603#1, the setting of the TLB #1 indicates no setting and is an address-through setting.

When the CPU #1 sets "0b1000" in the conversion register 603#1, the setting of the TLB #1 is a TLB-#1 setting 604-1. The TLB-#1 setting 604-1 designates the logical address spaces "0x0000" to "0x00ff" as the physical address spaces of the shared memory block #1.

When the CPU #1 sets "0b1100" in the conversion register 603#1, the setting of the TLB #1 is a TLB-#1 setting 604-2. The TLB-#1 setting 604-2 designates the logical address spaces "0x0000" to "0x01ff" as the physical address spaces of the shared memory blocks #1 and #2. In this manner, the physical address spaces accessible by the ports #1 and #2 are aggregated for the port #1 from the state where the port #1 is able to access the shared memory block #1 and the port #2 is able to access the shared memory block #2.

When the CPU #1 sets "0b1010" in the conversion register 603#1, the setting of the TLB #1 is a TLB-#1 setting 604-3. The TLB-#1 setting 604-3 designates the logical address spaces "0x0000" to "0x01ff" as the physical addresses of the shared memory blocks #1 and #3. In this manner, the physical address spaces accessible by the ports #1 and #3 are aggregated for the port #1 from the state where the port #1 is able to access the shared memory block #1 and the port #3 is able to access the shared memory block #3.

When the CPU #1 sets "0b1110" in the conversion register 603#1, the setting of the TLB #1 is a TLB-#1 setting 604-4. The TLB-#1 setting 604-4 designates the logical address spaces "0x0000" to "0x02ff" as the physical addresses of the shared memory blocks #1 to #3. In this manner, the physical address spaces accessible by the ports #1 to #3 are aggregated for the ports #1 to #3 from the state where the ports #1 to #3 are able to access the shared memory blocks #1 to #3, respectively.

Similarly, the conversion registers 603#2 to 603#4 designate the address conversion methods for the TLBs #2 to #4. Though the conversion registers 603 designate the contents of the TLBs in the embodiment, the conversion registers 603 may directly write the contents of the TLBs.

FIG. 7 is an explanatory diagram of an example of the content of the parallel degree information table 401. The parallel degree information table 401 includes, for example, three fields respectively for software name, parallel degree information, and parallel count P. The software name field stores the name of software. For example, this field has a starting address set therein of a process corresponding to the software, and the CPU is able to execute processing by referring to the starting address of the process.

The parallel degree information stores identifiers each indicating whether CPUs are execute software independently, or multiple CPUs operate in parallel to execute software. The stored identifiers are those for "independent" and "parallel". The "independent" identifier indicates that the software stored in the software name field is independent software to be executed by one CPU. The "parallel" identifier indicates that the software indicated in the software name field is parallel software to be executed by two or more CPUs. The parallel count P field indicates the number of CPUs used when the software of the software name in the software name field is executed. For example, a UI process is independent software and is executed by one CPU. A web browser is parallel software and is executed by three CPUs.

Figure 8:
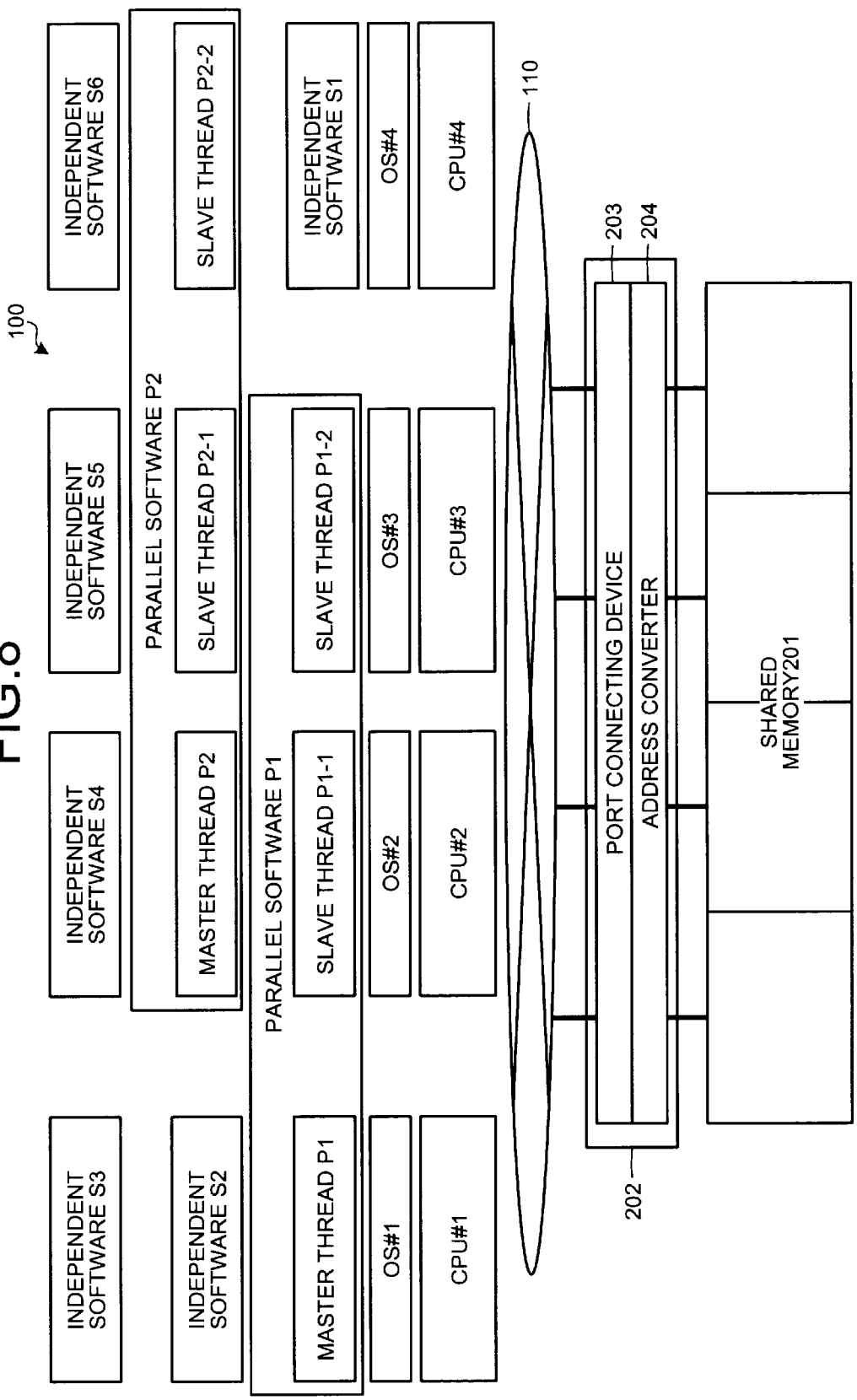
FIG. 8 is an explanatory diagram of a state where independent software and parallel software are loaded concurrently.

FIG. 8 is an explanatory diagram of the state where independent software and parallel software are loaded concurrently. The multi-core processor system 100 executes parallel software P1 and P2 and independent software S1 to S6. The CPUs #1 to #4 access the shared memory 201 through the memory controller 202.

The state of execution of the software by the CPUs will be described. Using an OS #1, the CPU #1 sequentially executes a master thread P1 of the parallel software P1 and the independent software S2 and S3. Using an OS #2, the CPU #2 sequentially executes a slave thread P1-1 of the parallel software P1, a master thread P2 of the parallel software P2, and the independent software S4. Using an OS #3, the CPU #3 sequentially executes a slave thread P1-2 of the parallel software P1, a slave thread P2-1 of the parallel software P2, and the independent software S5. Using an OS #4, the CPU #4 sequentially executes the independent software S1, a slave thread P2-2 of the parallel software P2, and the independent software S6.

Figure 9:
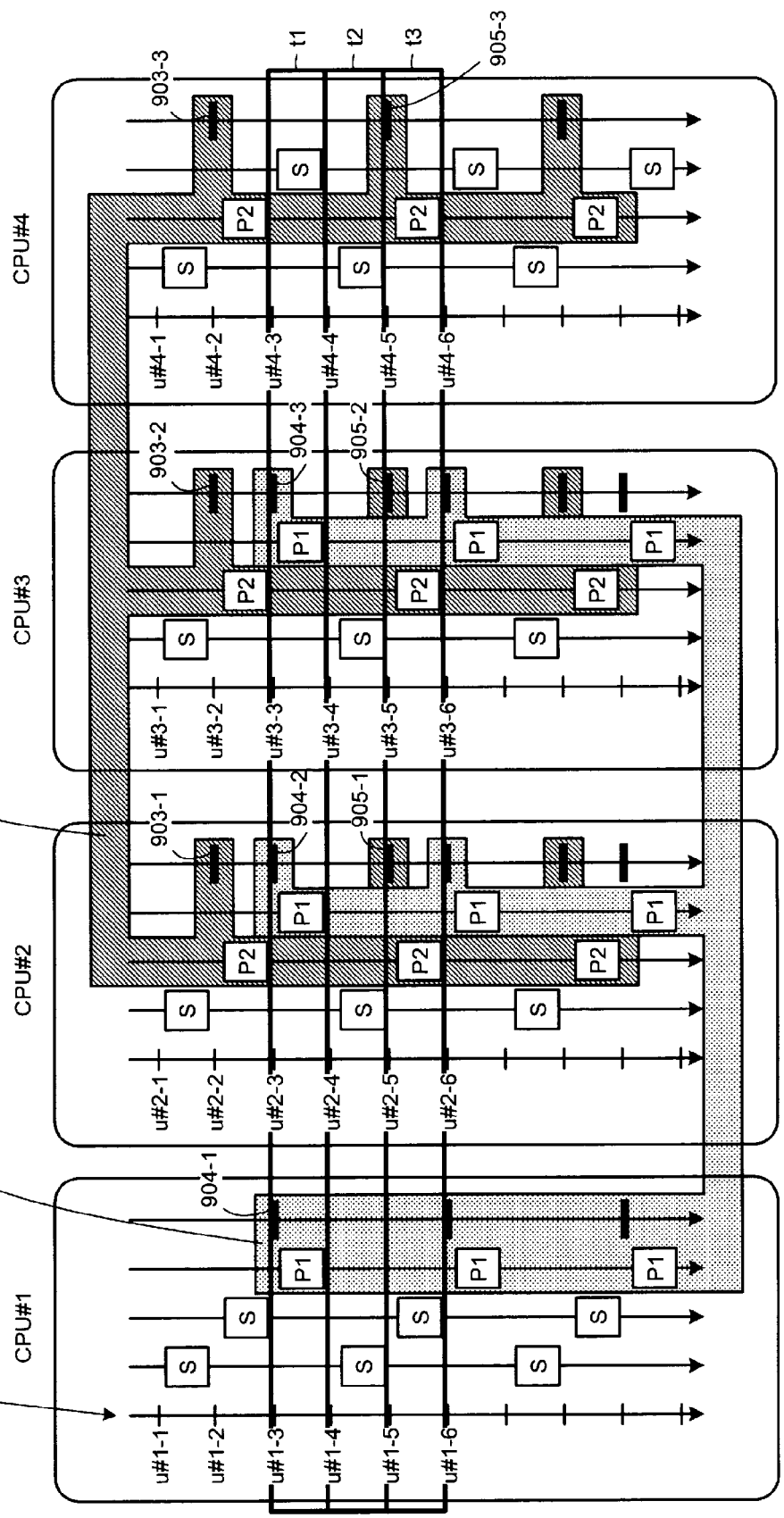
FIG. 9 is an explanatory diagram of patterns of a dispatch cycle of CPUs depicted in FIG. 8.

FIG. 9 is an explanatory diagram of patterns of the dispatch cycle of the CPUs depicted in FIG. 8. The CPUs #1 to #4 regularly notify the ports #1 to #4 of the setting of the memory controller 202, by converter setting processes. A "converter setting process" is a process of making settings of the setting register 501 of the port connecting device 203 and the conversion register 603 of the address converter 204.

For example, the port #1 can perform the setting of the independent software using a converter setting process u#1-1. The settings of the independent software are performed by converter setting processes u#2-1, u#3-1, and u#4-1 respectively for the ports #2, #3, and #4 at the time when the converter setting process u#1-1 is executed. An example of the setting process includes a connection setting and a cancellation setting that are executed for the port connecting device 203, and a logical non-continuous space setting and a logical continuous space setting that are executed for the address converter 204. Execution of the logical continuous space setting aggregates the physical address spaces that are accessible by multiple ports into the physical address spaces that are accessible by one port.

After a given time period elapses, converter setting processes u#1-2 to u#4-2 update the settings of the ports #1 to #4. The setting of the port #1 is updated to the setting for the independent software by the converter setting process u#1-2 and the settings of the ports #2 to #4 are updated to the settings for the parallel software P2 by the converter setting processes u#2-2 to u#4-2 as an example. In this example, the settings for the parallel software P2 are simultaneously made and therefore, the CPUs controlling the ports #2 to #4 are able to execute barrier synchronization codes 903-1 to 903-3.

The "barrier synchronization code" is code to wait for the processing needing synchronization of each of the CPUs to come to an end. For example, in the embodiment, the CPUs #2, #3, and #4 respectively execute the control of the ports #2, #3, and #4. Therefore, after the CPU #2 executes the converter setting process u#2-2, the CPU #2 executes the barrier synchronization code 903-1 and stands by.

Similarly, the CPUs #3 and #4 each execute the converter setting process and thereafter, each execute the barrier synchronization code and stand by. The time when the execution of the barrier synchronization codes by the CPUs #2 to #4 come to an end, is detected as the starting time for starting the execution of the software and the CPUs standing by resume operation and execute the parallel software P2. Thereby, the CPUs #2 to #4 are able to simultaneously access the parallel software P2.

Synchronization code 901 with the parallel software P1 is code for the parallel software P1 to access the continuous logical address spaces. At, for example, time t1, the synchronization code 901 causes converter setting processes u#1-3 to u#3-3 and barrier synchronization codes 904-1 to 904-3 to make the setting of the parallel software P1.

Similarly, synchronization code 902 with the parallel software P2 is code for the parallel software P2 to access the continuous logical address spaces. At, for example, time t3, the synchronization code 902 causes converter setting processes u#2-5 to u#4-5 and barrier synchronization codes 905-1 to 905-3 to make the setting of the parallel software P2.

FIGS. 10 to 15 depict the state of the execution of the software by the multi-core processor system 100 and the state of a setting of the memory controller 202 at times t1 to t3.

Figure 10:
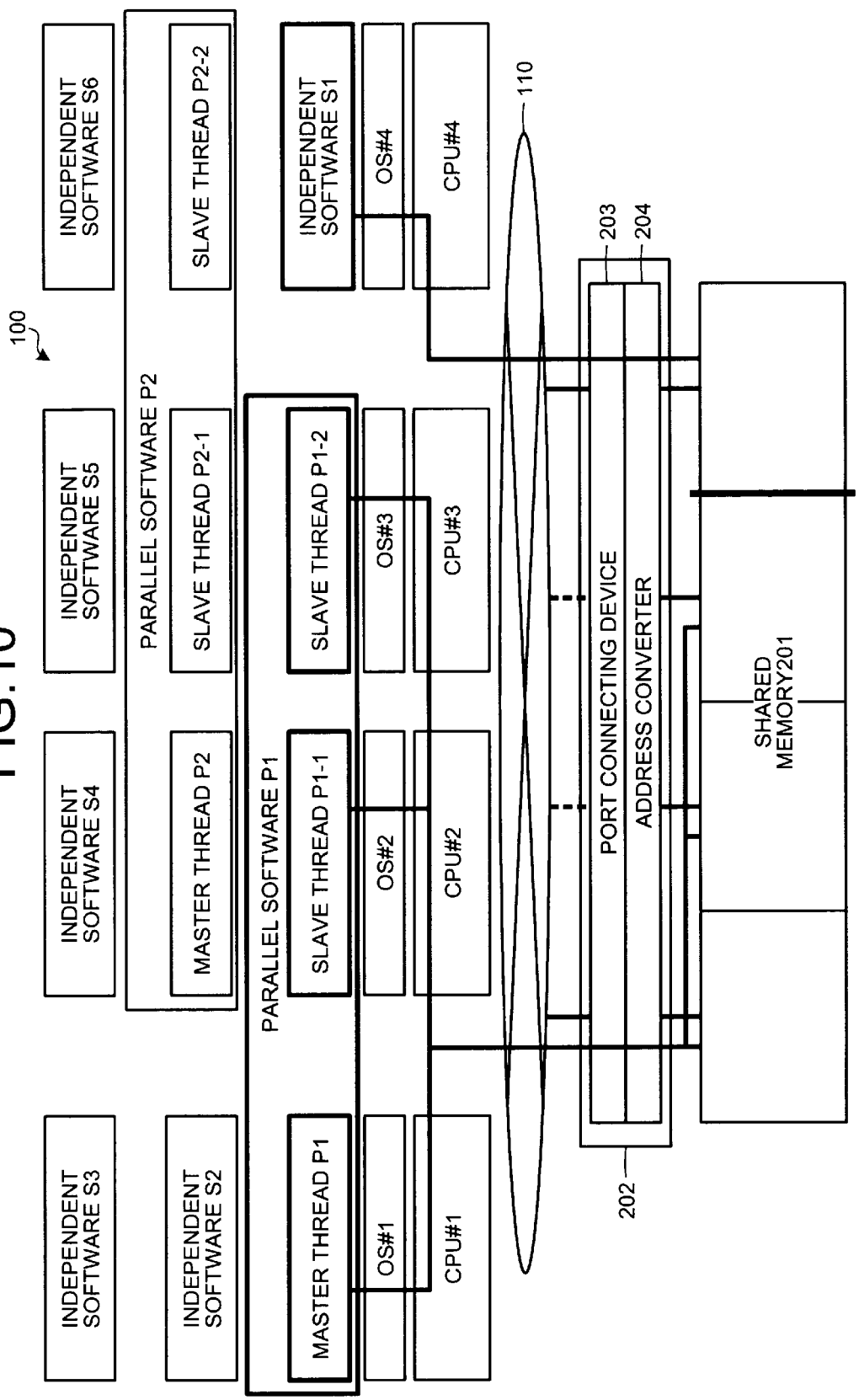
FIG. 10 is an explanatory diagram of a state of the execution of software and a state of the setting of a memory controller 202 at time t1.

FIG. 10 is an explanatory diagram of the state of the execution of the software and the state of the setting of the memory controller 202 at time t1. The multi-core processor system 100 at time t1 executes the parallel software P1 using the CPUs #1 to #3 and executes the independent software S1 using the CPU #4. The state of the setting of the memory controller 202 is such that the port #1 becomes the master port and accesses the shared memory 201 in response to the execution of the parallel software P1 by the CPUs #1 to #3. The ports #2 and #3 are in disconnection states. The port #4 also becomes the master port and the port #4 accesses the shared memory 201 in response to the execution of the independent software S1 by the CPU #4.

Figure 11:
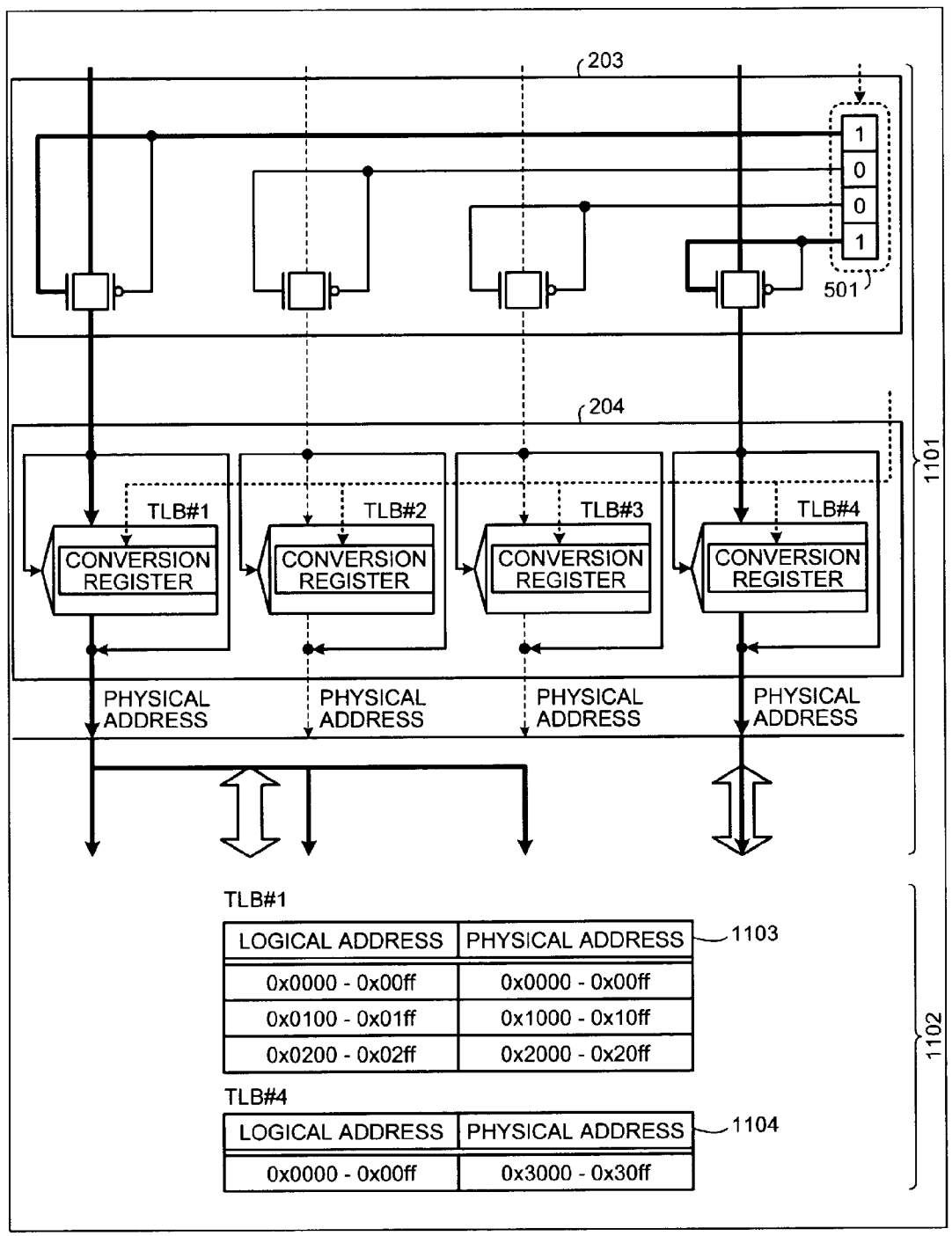
FIG. 11 is an explanatory diagram of the state of the memory controller 202 at time t1.

FIG. 11 is an explanatory diagram of the state of the memory controller 202 at time t1. A section denoted by a reference numeral "1101" depicts the state of the port connecting device 203 and that of the address converter 204. Tables denoted by a reference numeral "1102" indicate the state of the settings of the TLBs #1 and #4. In the port #1, the converter setting process u#1-3 sets "1" in the setting register 501-1. Thereby, the port #1 is set to be in a connection state. For the port #1, the converter setting process u#1-3 sets "0b1110" in the conversion register 603#1, whereby a TLB-#1 setting 1103 is set in the TLB #1. Thus, the port #1 is able to access the shared memory blocks #1 to #3 and provide the parallel software P1 with the continuous logical address spaces "0x0000" to "0x02ff".

For the port #2, a converter setting process u#2-3 sets "0" in the setting register 501-2, whereby the port #2 is set to be in a disconnection state. Similarly, for the port #3, a converter setting process u#3-3 sets "0" in the setting register 501-3, whereby the port #3 is set to also be in a disconnection state. For the port #4, a converter setting process u#4-3 sets "1" in the setting register 501-4, whereby the port #4 is set to be in a connection state. For the port #4, the converter setting process u#4-3 sets a TLB-#4 setting 1104 in the TLB #4. Thereby, the port #4 is able to access the shared memory block #4 and provide the independent software S1 with the logical address spaces converted from the physical address spaces.

Figure 12:
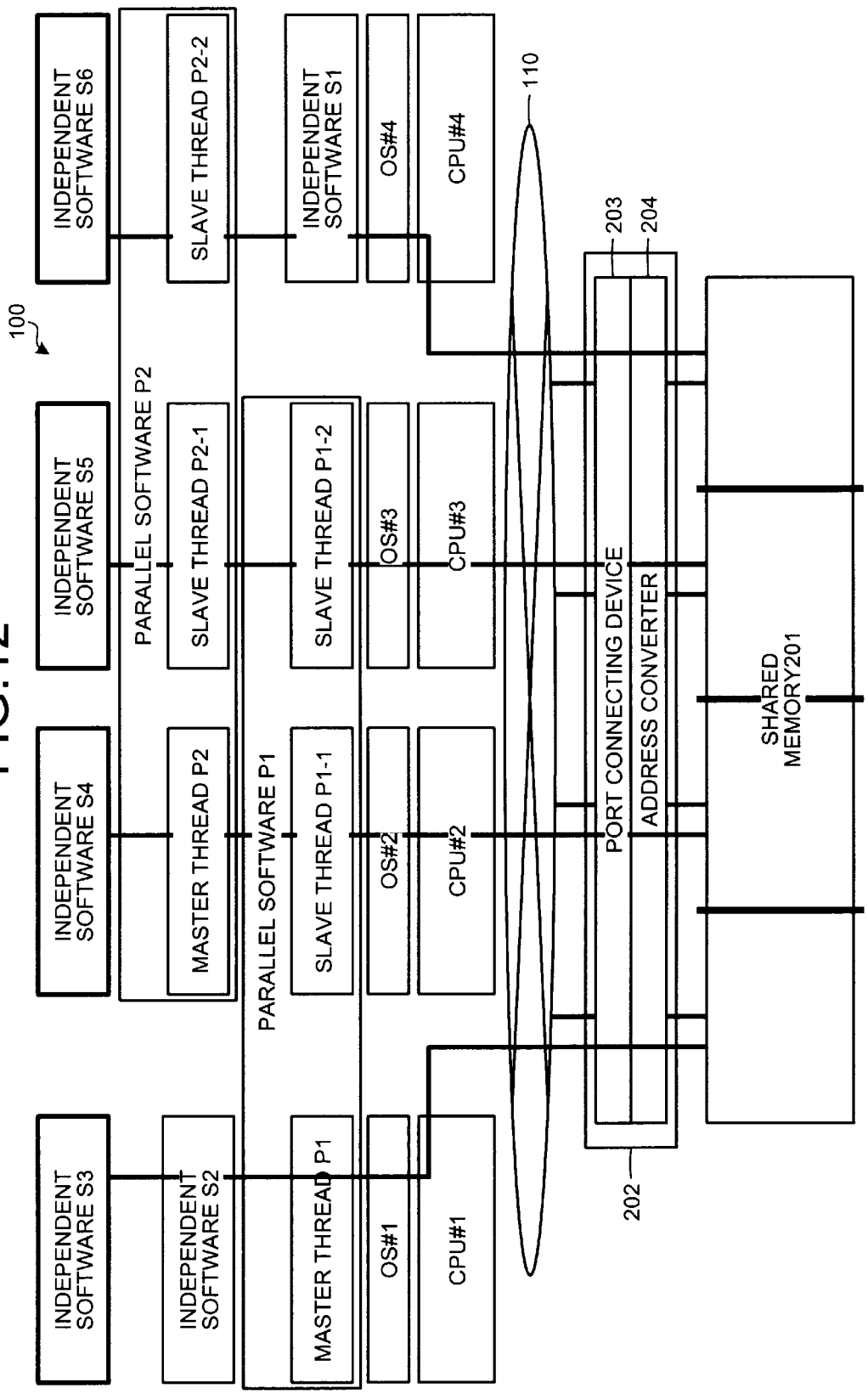
FIG. 12 is an explanatory diagram of the state of the execution of the software and the state of the setting of the memory controller 202 at time t2.

FIG. 12 is an explanatory diagram of the state of the execution of the software and the state of the setting of the memory controller 202 at time t2. The multi-core processor system 100 at time t2 executes the independent software S3 using the CPU #1 and also executes the independent software S4 using the CPU #2, the independent software S5 using the CPU #3, and the independent software S6 using the CPU #4. The ports

1 to #4 become the master ports and access the shared memory 201 as the state of the setting of the memory controller 202.

Figure 13:
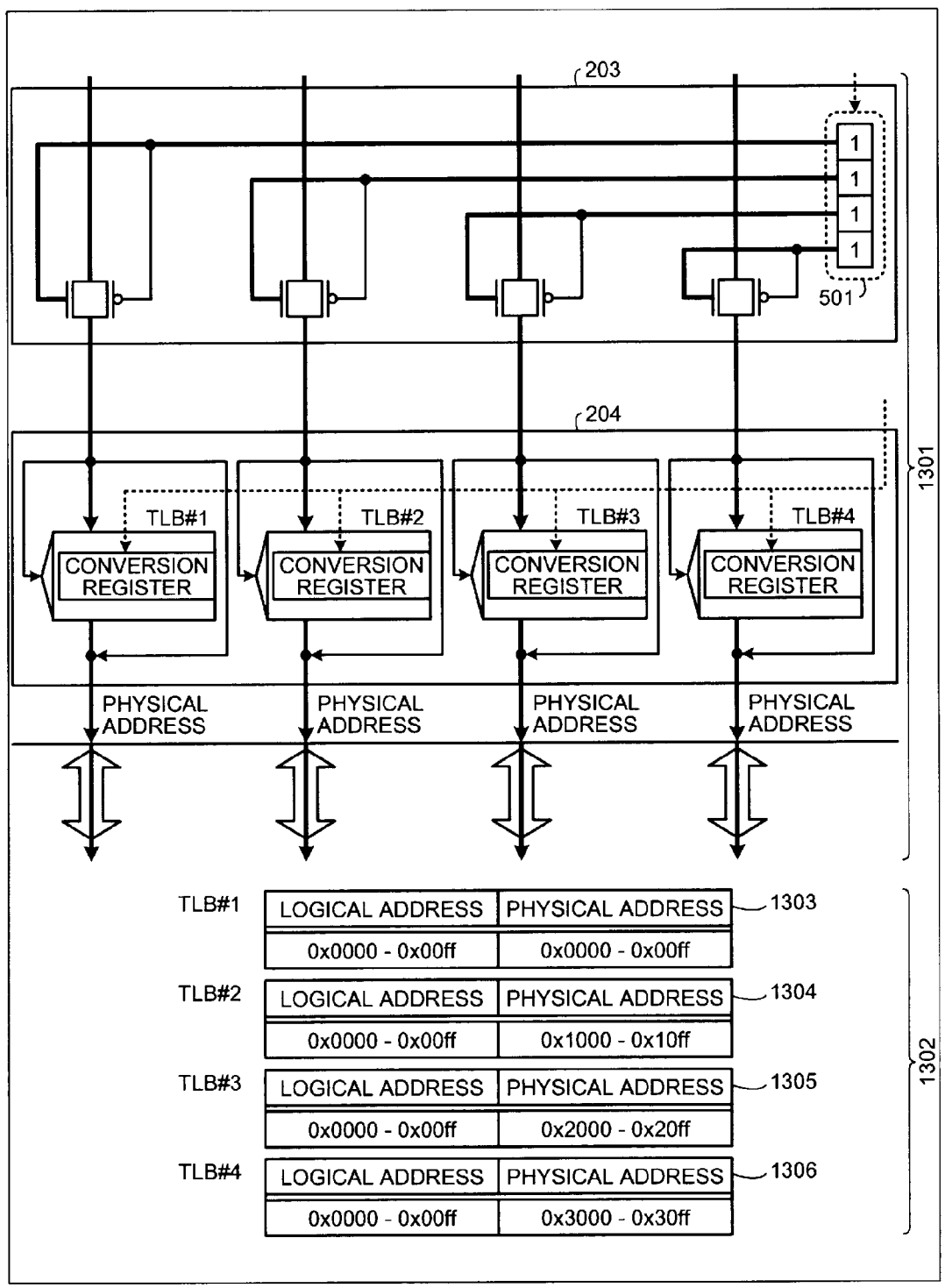
FIG. 13 is an explanatory diagram of the state of the memory controller 202 at time t2.

FIG. 13 is an explanatory diagram of the state of the memory controller 202 at time t2. A section denoted by a reference numeral "1301" depicts the state of the port connecting device 203 and the state of the address converter 204. Tables denoted by a reference numeral "1302" indicate the state of the settings of the TLBs #1 to #4. For the port #1, the converter setting process u#1-4 sets "1" in the setting register 501-1, whereby the port #1 is set to be in a connection state. For the port #1, the converter setting process u#1-4 sets a TLB-#1 setting 1303 in the TLB #1, whereby the port #1 is able to access the shared memory block 201#1 and provide the independent software S3 with the logical address spaces converted from the physical address spaces.

The same operations are executed for the ports #2 to #4. A converter setting process u#2-4 sets the port #2 to be in a connection state and the port #2 accesses the shared memory block 201#2. A TLB#2 setting 1304 is set in the TLB #2 and the port #2 provides the independent software S4 with the logical address spaces. A converter setting process u#3-4 sets the port #3 to be in a connection state and the port #3 accesses the shared memory block 201#3. A TLB#3 setting 1305 is set in the TLB #3 and the port #3 provides the independent software S5 with the logical address spaces. A converter setting process u#4-4 sets the port #4 to be in a connection state and the port #4 accesses the shared memory block 201#4. A TLB#4 setting 1306 is set in the TLB #4 and the port #4 provides the independent software S6 with the logical address spaces.

Figure 14:
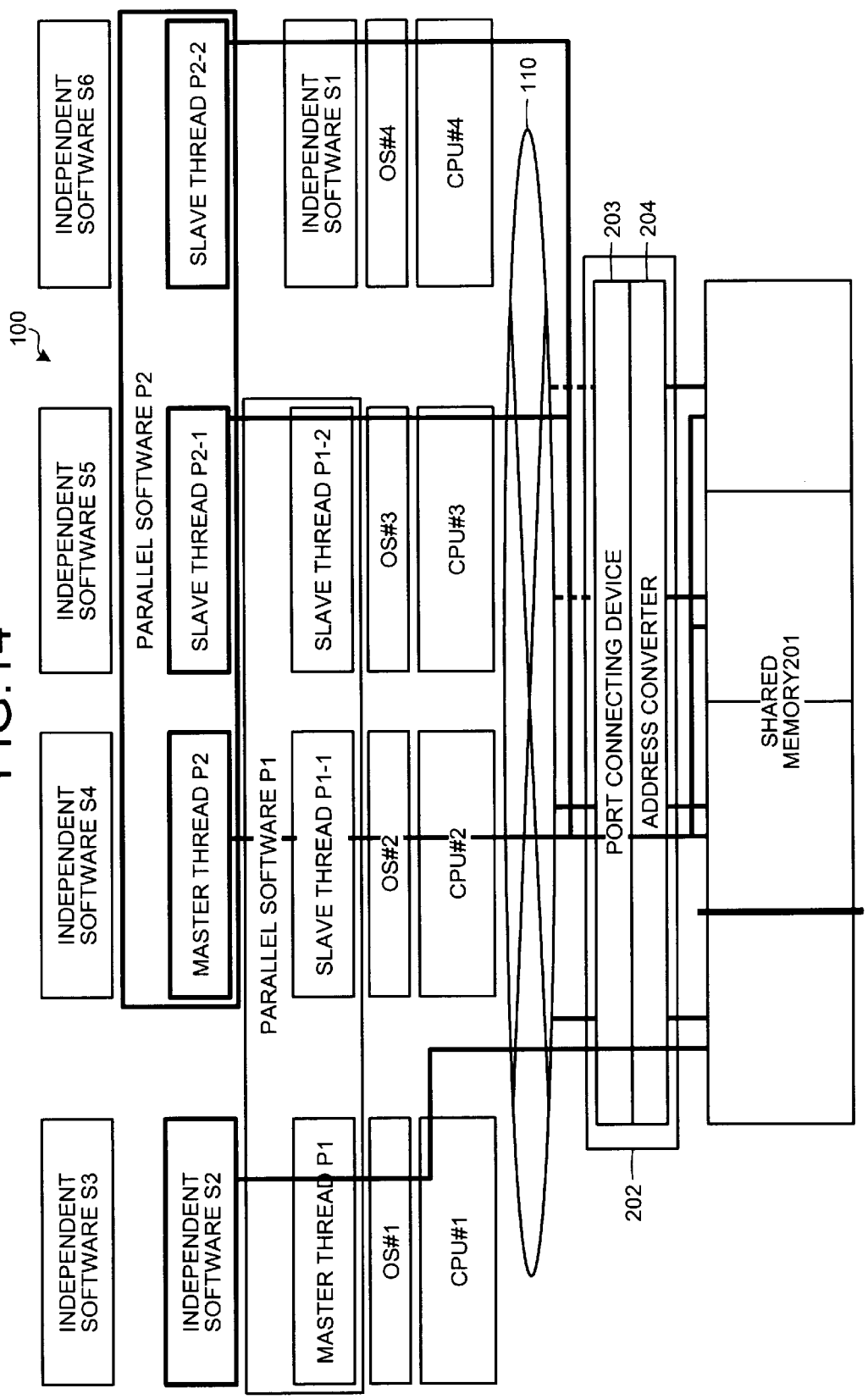
FIG. 14 is an explanatory diagram of the state of the execution of the software and the state of the setting of the memory controller 202 at time t3.

FIG. 14 is an explanatory diagram of the state of the execution of the software and the state of the setting of the memory controller 202 at time t3. The multi-core processor system 100 at time t3 executes the independent software S2 using the CPU #1 and executes the parallel software P2 using the CPUs #2 to #4. The port #1 becomes a master port and accesses the shared memory 201 in response to the execution of the independent software S2 by the CPU #1 as the state of the setting of the memory controller 202. The port #2 also becomes another master port and accesses the shared memory 201 in response to the execution of the parallel software P2 by the CPUs #2 to #4. The ports #3 and #4 are in disconnection states.

Figure 15:
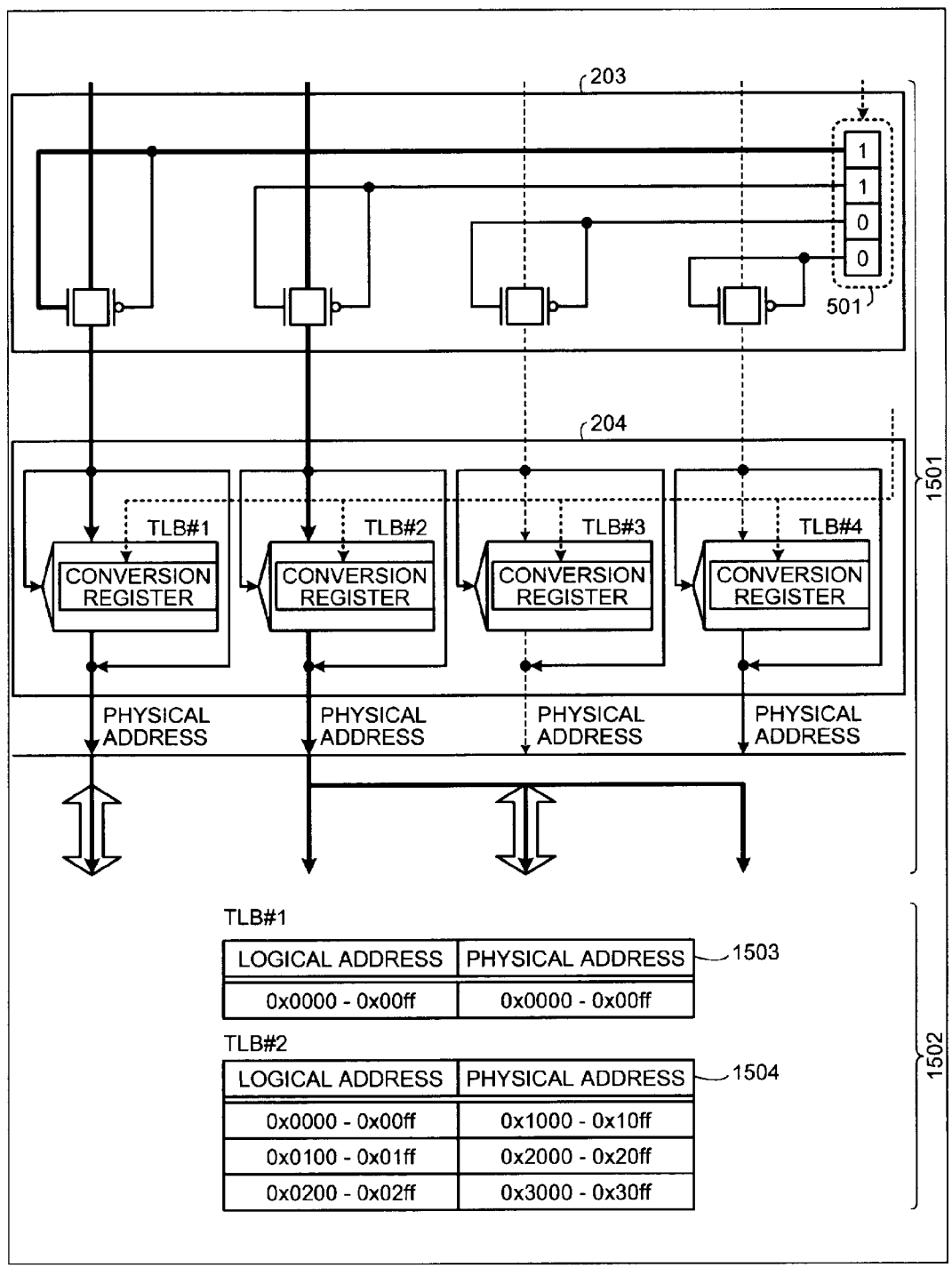
FIG. 15 is an explanatory diagram of the state of the memory controller 202 at time t3.

FIG. 15 is an explanatory diagram of the state of the memory controller 202 at time t3. A section denoted by a reference numeral "1501" depicts the state of the port connecting device 203 and the state of the address converter 204. Tables denoted by a reference numeral "1502" depict the state of the settings of the TLBs #1 and #2. For the port #1, a converter setting process u#1-5 sets "1" in the setting register 501-1, whereby the port #1 is set to be in a connection state. For the port #1, the converter setting process u#1-5 sets "0b1000" in the conversion register 603#1, whereby a TLB-#1 setting 1503 is set in the TLB #1. Thus, the port #1 is able to access the shared memory block 201#1 and provide the independent software S2 with the logical address spaces converted from the physical address spaces.

For the port #2, a converter setting process u#2-5 sets "1" in the setting register 501-2, whereby the port #2 is set to be in a connection state. For the port #2, the converter setting process u#2-5 sets a TLB-#2 setting 1504 in the TLB #2, whereby the port #2 is able to access the shared memory blocks 201#2 to 201#4 and provide the parallel software P2 with the continuous logical address spaces "0x0000" to "0x02ff".

For the port #3, a converter setting process u#3-5 sets "0" in the setting register 501-3, whereby the port #3 is set to be in a disconnection state. Similarly, for the port #4, a converter setting process u#4-5 sets "0" in the setting register 501-4, whereby the port #4 is also set to be in a disconnection state.

Figure 16:
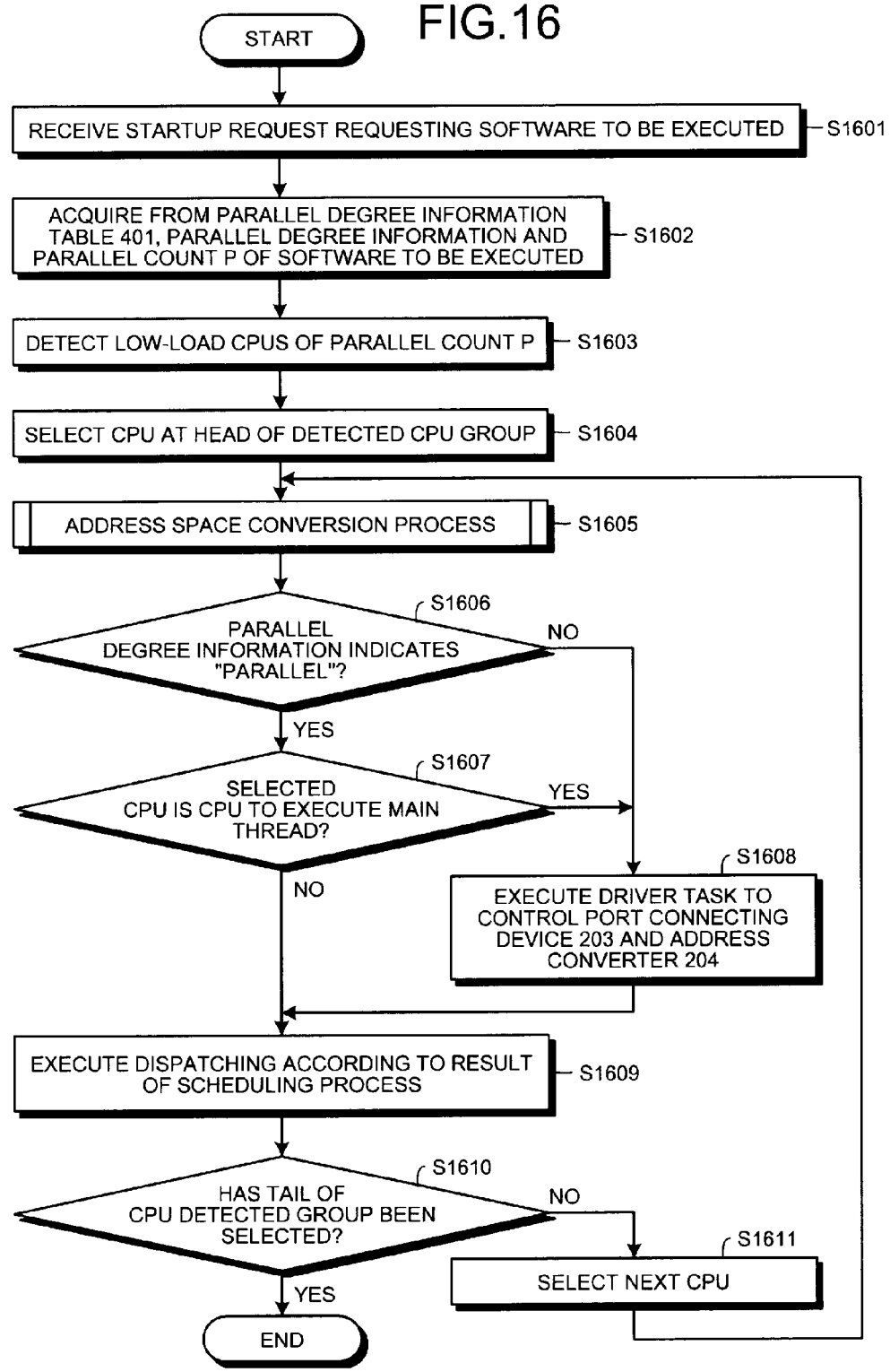
FIG. 16 is a flowchart of a scheduling process.

FIG. 16 is a flowchart of a scheduling process. The scheduling process is executed by the schedulers #1 to #4 as a function thereof when the software is started up. A designated CPU among the CPUs 101 executes steps S1601 to S1604, S1610, and S1611. The CPU detected at step S1603 executes steps S1605 to S1609. In the embodiment, the designated CPU is assumed to be the CPU #1.

The CPU #1 receives the startup request requesting the software to be executed (step S1601). The startup request is issued by, for example, an operation by the user using the UI. The CPU #1 acquires the parallel degree information and the parallel count P of the software to be executed, from the parallel degree information table 401 (step S1602) and detects parallel-count-P low-load CPUs (step S1603).

For example, the CPU #1 is able to detect P CPUs from among the low-load CPUs, according to the state of use of the CPUs, based on the information by the schedulers #1 to #4. The "state of use of the CPUs" may be the rate of use of the CPUs or may be the rate of use of the CPU memory. For example, when P is P=2 and the CPUs in descending order of state of use are CPUs 4, 3, 2, and 1, the CPU #1 is able to detect the CPUs 2 and 1.

After the detection, the CPU #1 selects the CPU at the head of the detected CPU group (step S1604). The CPU selected executes an address space conversion process (step S1605). The details of the address space conversion process will be described later with reference to FIG. 17. After the process, the selected CPU determines whether the parallel degree information of the software to be executed indicates "parallel" (step S1606).

If the selected CPU determines that the parallel degree information indicates "independent" (step S1606: NO), the selected CPU executes a driver task to control the port connecting device 203 and the address converter 204 (step S1608). The content of the operation of the driver task is a task to make the settings of the port connecting device 203 and the address converter 204 set by the process at step S1605 and to execute the barrier synchronization code at specific cycles.

If the selected CPU determines that the parallel degree information indicates "parallel" (step S1606: YES), the selected CPU determines whether the selected CPU is the CPU to execute the main thread of the software to be executed (step S1607). If the selected CPU determines that the selected CPU is the CPU to execute the main thread (step S1607: YES), the selected CPU proceeds to a process at step S1608. If the selected CPU determines that the selected CPU is the CPU to execute the slave thread (step S1607: NO) or after the process at step S1608 comes to an end, the selected CPU executes dispatching according to the result of the scheduling process (step S1609).

After step S1609 comes to an end, the CPU #1 determines whether the selected CPU is the CPU at the tail of the detected CPU group (step S1610). If the CPU #1 determines that the selected CPU is not the CPU at the tail (step S1610: NO), the CPU #1 selects the next CPU in the detected CPU group (step S1611) and proceeds to the process at step S1605. If the CPU #1 determines that the selected CPU is the CPU at the tail (step S1610: YES), the CPU #1 causes the scheduling process to come to an end.

FIG. 17 is a flowchart of the address space conversion process. The address space conversion process is executed by the selected CPU at step S1604 or S1611. The CPU selected determines whether the parallel count P is one (step S1701). If the selected CPU determines that the parallel count P is one (step S1701: YES), the selected CPU executes the connection setting for the port connecting device 203 (step S1702) and the logical non-continuous space setting for the address converter 204 (step S1703), and causes the address space conversion process to come to an end.

The "connection setting for the port connecting device 203" is a process of setting the port corresponding to the selected CPU to be in a connection state. For example, when the selected CPU is the CPU #1, the CPU #1 is able to set "1" in the setting register 501#1 that controls the connection state of the port #1. The "logical non-continuous space setting for the address converter 204" is a setting of correlating the logical address spaces of the software with the physical address spaces of any one of the shared memory blocks #1 to #4 of the port corresponding to the selected CPU.

If the selected CPU determines that the parallel count P is not one (step S1701: NO), the selected CPU determines whether the selected CPU is the CPU to execute the main thread (step S1704). If the selected CPU determines that the selected CPU is the CPU to execute the main thread (step S1704: YES), the selected CPU executes the connection setting for the port connecting device 203 (step S1705) and the logical continuous space setting for the address converter 204 (step S1706). The "logical continuous space setting for the address converter 204" is a setting of aggregating and correlating the logical address spaces of the software into and with the physical address spaces of two or more shared memory blocks among the shared memory blocks #1 to #4 of the port corresponding to the selected CPU. The logical addresses correlated are set to be a continuous space.

If the selected CPU determines that the selected CPU is not the CPU to execute the slave thread (step S1704: NO), the selected CPU executes a cancellation setting for the port connecting device 203 (step S1707). The "cancellation setting for the port connecting device 203" is a process of setting the port corresponding to the selected CPU to be in a disconnection state. The connection setting for the port connecting device 203, the cancellation setting for the port connecting device 203, the logical non-continuous space setting for the address converter 204, and the logical continuous space setting for the address converter 204 constitute the converter setting process described with reference to FIG. 9.

After the process at step S1706 or S1707 comes to an end, the selected CPU executes a simultaneous execution setting for a thread dispatcher (step S1708). For example, the selected CPU registers the software to be executed in the thread dispatcher as the software to simultaneously execute the software to be executed. The CPU selected sets the barrier synchronization code and the cycle timing (step S1709) and causes the address space conversion process to come to an end. By executing the barrier synchronization code before the parallel software is executed, the CPU group to execute the parallel software is able to detect the starting time to simultaneously execute the parallel software. The "setting of the cycle timing" refers to making a setting such that the software to be executed is assigned to the CPUs at the same timing.

As described, according to the multi-core processor system, the memory controller control method, and the memory controller control program, a CPU is determined to which the software that is to be executed is assigned, after the physical address spaces are divided among the ports; the logical addresses defined by the software to be executed are designated from among the physical address spaces that are accessible by the port corresponding to the CPU, and the port is notified of to the addresses; and, thereafter, the software to be executed is started up.

Thus, the physical address spaces of the port accessed by the CPU executing the software to be executed and the physical address spaces of the ports accessed by the other CPUs are different from each other and therefore, access contention can be prevented.

When multiple designated ports are present that correspond to the CPU to which the software to be executed is assigned, the multi-core processor system may select one arbitrary port and may cancel the connection of each of the ports not selected. The multi-core processor system may aggregate the physical address spaces of the designated port and may set the physical address spaces aggregated in the physical address spaces of the port selected.

Thereby, access contention can be prevented among the software and the cancellation of the unnecessary ports enables an electricity-consumption saving effect to be achieved. When the logical address spaces accessed by the master thread and those accessed by the slave thread are away from each other for the software to be executed using multiple CPUs, no aggregation of the physical address spaces needs to be executed, whereby access contention can be prevented within the software.

When multiple CPUs are present to which the software to be executed is assigned, the multi-core processor system may notify the software of the start of the execution after the notification of the address conversion to the designated port has been completed.

Thus, access contention can be prevented among the software and the software each assigned to multiple CPUs can be loaded concurrently. An example of the concurrent loading is the state where, as depicted in FIG. 8, the parallel software P1 is assigned to the CPUs #1 to #3 and the parallel software P2 is assigned to the CPUs #2 to #4. Even when the software is loaded concurrently, the parallel software is adapted to be executed at the same timing in the cores. When the parallel software is to be executed, the designated port of the memory controller is notified of the address conversion and after this notification, the parallel software is executed. Thus, the multi-core processor system can operate normally.

The number of cores and the number of the ports in the multi-core processor system may be equivalent, whereby the CPUs and the ports are in one-to-one correspondence and access contention can be prevented among the CPUs. Even when the number of ports is smaller than that of the CPUs, access contention can be prevented among some of the CPUs.

For example, in a multi-core processor system including four CPUs and three ports, the CPUs #1 and #2 can be correlated respectively with the ports #1 and #2, and the CPUs #3 and #4 can to be correlated with the port #3. In this case, access contention can be prevented among the CPUs #1, #2, and #3 or #4. When the software assigned to the CPUs #3 and #4 is software that frequently accesses the memory of the CPUs, the software may use one port and the same logical address spaces.

As described, when multiple CPUs are determined to which software having high dependency relations with each other are assigned, the number of ports prepared is equivalent to the number of CPUs and the ports corresponding to the determined CPUs are consolidated to one port, whereby the cost for port wiring can be suppressed.

The memory controller control method described in the present embodiment may be implemented by executing a prepared program on a computer such as a personal computer and a workstation. The program is stored on a computer-readable recording medium such as a hard disk, a flexible disk, a CD-ROM, an MO, and a DVD, read out from the computer-readable medium, and executed by the computer. The program may be distributed through a network such as the Internet.

According to the multi-core processor system, the memory controller control method, and the memory controller control program, an address range accessed by a CPU and that accessed by another CPU are different from each other, thereby enabling access contention to be prevented.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A multi-core processor system comprising
    a plurality of cores;
    a memory controller including a plurality of ports corresponding to the cores; and
    shared memory including physical address spaces assigned to each of the ports and memorizing correlation information which correlates a software performed with the cores and a number of a cores to which the software to be assigned, wherein
        a first core among the cores assigns an execution core which performs software for execution among the cores based on the correlation information and each processing load of the cores;
        the execution core sets a logical address space of the assigned software for execution, and the physical address space assigned to an execution port corresponding to the execution core to the memory controller, respectively; and
        the first core makes the memory controller release connection with the ports corresponding to the cores except the execution core.

2. The multi-core processor system according to claim 1, wherein the first core is configured to:
    select, when a plurality of designated ports are present corresponding to the assigned cores, an arbitrary port from among the designated ports;
    notify ports remaining after excluding the selected port from among the designated ports, of cancellation of connection of the ports remaining; and
    aggregate physical address spaces accessible by the designated ports, wherein
    the first core sets the aggregated physical address spaces in physical address spaces newly accessible by the selected port, and
    the first core notifies the selected port of the newly accessible physical address spaces.

3. The multi-core processor system according to claim 2, wherein the first core is configured to
    detect, upon assigning a plurality of cores, a starting time for the assigned cores to simultaneously execute the software to be executed, wherein
    the first core notifies the designated ports of the set physical address spaces and the logical address spaces corresponding to the set physical address spaces,
    the first core detects, as the starting time, the time at which the notification to the designated ports is completed, and
    the first core notifies the software to be executed of the start of execution, after detecting the starting time.

4. The multi-core processor system according to claim 3, wherein
    the number of cores and the number of ports are equivalent.

5. A control method of a multi-core processor system comprising a plurality of cores; a memory controller including a plurality of ports corresponding to the cores; and shared memory including physical address spaces assigned to each of the ports and memorizing correlation information which correlates a software performed with the cores and a number of a cores to which the software to be assigned, the method being executed by the multi-core processor system and the method comprising:
    assigning an execution core which performs software for execution among the cores based on the correlation information and each processing load of the cores;
    setting a logical address space of the assigned software for execution, and the physical address space assigned to an execution port corresponding to the execution core to the memory controller; and
    releasing connection of the memory controller with the ports corresponding to the cores except the execution core.

6. A non-transitory computer-readable recording medium storing a program causing a multi-core processor system comprising a plurality of cores; a memory controller including a plurality of ports corresponding to the cores; and shared memory including physical address spaces assigned to each of the ports and memorizing correlation information which correlates a software performed with the cores and a number of a cores to which the software to be assigned, to execute a process comprising:
    assigning an execution core which performs software for execution among the cores based on the correlation information and each processing load of the cores;
    setting a logical address space of the assigned software for execution, and the physical address space assigned to an execution port corresponding to the execution core to the memory controller; and
    releasing connection of the memory controller with the ports corresponding to the cores except the execution core.

* * * * *